(12) United States Patent
Zhong et al.

(10) Patent No.: US 12,417,946 B2
(45) Date of Patent: Sep. 16, 2025

(54) FILM SCHEME TO REDUCE PLASMA-INDUCED DAMAGE

(71) Applicant: Taiwan Semiconductor Manufacturing Company, Ltd., Hsinchu (TW)

(72) Inventors: Chia-Wen Zhong, Taichung (TW); Yen-Liang Lin, Yilan County (TW); Yao-Wen Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 550 days.

(21) Appl. No.: 17/856,419

(22) Filed: Jul. 1, 2022

(65) Prior Publication Data
US 2023/0343642 A1    Oct. 26, 2023

Related U.S. Application Data

(60) Provisional application No. 63/332,900, filed on Apr. 20, 2022.

(51) Int. Cl.
*H01L 21/768* (2006.01)
*H01L 21/285* (2006.01)
(Continued)

(52) U.S. Cl.
CPC .. *H01L 21/76865* (2013.01); *H01L 21/76885* (2013.01); *H01L 23/5226* (2013.01);
(Continued)

(58) Field of Classification Search
CPC ......... H01L 21/76865; H01L 21/76885; H01L 23/5226; H01L 23/53223; H01L 23/53238;
(Continued)

(56) References Cited

U.S. PATENT DOCUMENTS 6,037,013 A    3/2000  Hsu et al.
9,691,871 B1 * 6/2017  Caubet .............. H01L 21/28088
(Continued)

OTHER PUBLICATIONS

Cheng et al. "Investigation of BEOL Plasma Process Induced Damage Effect on Gate Oxide" IEEE 2015 Annual Reliability and Maintainability Symposium (RAMS), published on May 11, 2015.
(Continued)

*Primary Examiner* — Norman D Richards
*Assistant Examiner* — Sammantha K Salaz
(74) *Attorney, Agent, or Firm* — Eschweiler & Potashnik, LLC

(57) ABSTRACT

The present disclosure relates to an integrated chip structure. The integrated chip structure includes a substrate. One or more lower interconnects are disposed within a lower inter-level dielectric (ILD) structure over the substrate. A plasma induced damage (PID) mitigation layer is disposed over the lower ILD structure. The PID mitigation layer has a porous structure including a metal. A first upper interconnect is laterally surrounded by an upper ILD structure over the PID mitigation layer. The first upper interconnect extends from over the PID mitigation layer to the one or more lower interconnects.

20 Claims, 29 Drawing Sheets

(51) Int. Cl.
*H01L 23/522* (2006.01)
*H01L 23/532* (2006.01)

(52) U.S. Cl.
CPC .. *H01L 23/53223* (2013.01); *H01L 23/53238* (2013.01); *H01L 23/53266* (2013.01); *H01L 21/28568* (2013.01)

(58) Field of Classification Search
CPC ......... H01L 23/53266; H01L 21/28568; H01L 21/76829; H01L 21/2855; H01L 21/76841; H01L 23/5227; H01L 21/02183; H01L 21/02186; H01L 23/5283; H01L 23/53209
See application file for complete search history.

(56) References Cited

U.S. PATENT DOCUMENTS

| | | | |
|---|---|---|---|
| 10,546,949 B2 * | 1/2020 | Manippady | C30B 29/406 |
| 2004/0023126 A1 * | 2/2004 | Mancini | G03F 7/0002 |
| | | | 430/311 |
| 2019/0333807 A1 * | 10/2019 | Tung | H01L 21/7684 |
| 2020/0227316 A1 | 7/2020 | Tien et al. | |
| 2021/0257293 A1 * | 8/2021 | Lee | H01L 21/76829 |
| 2022/0102203 A1 | 3/2022 | Wang et al. | |

OTHER PUBLICATIONS

Messier et al. "Revised Structure Zone Model for Thin Film Physical Structure" Journal of Vacuum Science & Technology A 2, 500 (1984). Published in 1984.

Yurgens, A. "Film Structure" Published Dec. 4, 2004.

Engberg, David. "Atom Probe Tomography of TiSiN Thin Films" Linköping Studies in Science and Technology, published in 2015.

* cited by examiner

_US 12,417,946 B2_

FILM SCHEME TO REDUCE PLASMA-INDUCED DAMAGE

REFERENCE TO RELATED APPLICATION

This Application claims the benefit of U.S. Provisional Application No. 63/332,900, filed on Apr. 20, 2022, the contents of which are hereby incorporated by reference in their entirety.

BACKGROUND

Integrated chip fabrication is a complex multiple-step process during which electronic circuits are formed on a wafer made out of a semiconductor material (e.g., silicon). Integrated chip fabrication can be broadly divided into front-end-of-line (FEOL) processing and back-end-of-line (BEOL) processing. FEOL processing generally relates to the formation of devices (e.g., transistors) within the semiconductor material, while BEOL processing generally relates to the formation of conductive interconnects within a dielectric structure over the semiconductor material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
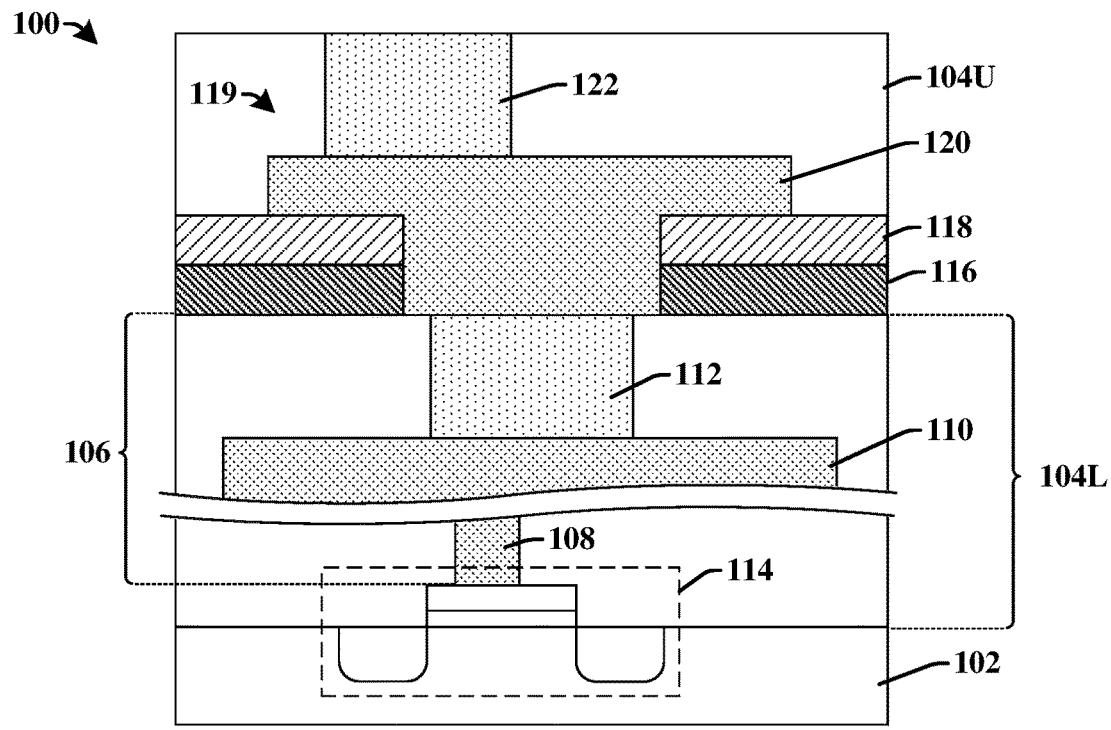
FIG. 1 illustrates a cross-sectional view of some embodiments of an integrated chip structure comprising a plasma induced damage (PID) mitigation layer configured to reduce plasma induced damage.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The semiconductor industry has continually improved the performance of integrated chips by scaling the minimum feature size of integrated chip (IC) components according to Moore's law. As minimum feature sizes have decreased, the size of conductive interconnects on the back-end-of-the line (BEOL) and the space between the conductive interconnects has also decreased. The smaller conductive interconnects and space therebetween has increased a density of the interconnects, thereby improving a performance of a corresponding integrated chip.

The high density of interconnects within modern-day integrated chips are made possible in-part by plasma processes (e.g., plasma etching and deposition processes). For example, plasma etching processes allow for trenches and/or via holes used in damascene processes to be formed with higher aspect ratios than non-plasma processes. Similarly, plasma deposition processes provide for improved gap fill over non-plasma processes. However, when plasma processes are used to form interconnect structures, charges from a plasma may flow through conductive interconnects to underlying semiconductor devices. The charges can stress and/or damage gate dielectrics in the underlying semiconductor devices, thereby degrading a quality of the gate dielectrics and resulting in a high gate leakage current, device failure, and/or other reliability issues. For core NMOS/PMOS devices, which may have a current leakage failure rate that are less than 5%, such stress and damage can make it difficult for the devices to pass reliability qualification.

The present disclosure relates to a method of forming an interconnect structure having a plasma induced damage (PID) mitigation layer configured to reduce plasma induced damage. In some embodiments, the method forms a lower interconnect within a lower inter-level dielectric (ILD) structure formed over a substrate. A plasma induced damage (PID) mitigation layer is formed over the lower interconnect and the lower ILD structure using a plasma deposition process performed at a relatively high pressure. The relatively high pressure increases collisions between charged particles within a plasma, thereby reducing an energy of charged particles within the plasma and mitigating plasma induced damage caused during formation of the PID mitigation layer. The PID mitigation layer is able to prevent plasma damage during the subsequent formation of overlying layers (e.g., an overlying metal nitride layer, an upper interconnect, etc.), thereby mitigating plasma induced damage on the integrated chip structure.

FIG. 1 illustrates a cross-sectional view of some embodiments of an integrated chip structure 100 comprising a plasma induced damage (PID) mitigation layer configured to reduce plasma induced damage.

The integrated chip structure 100 includes a lower inter-level dielectric (ILD) structure 104L disposed over a substrate 102. In some embodiments, the lower ILD structure 104L comprises one or more lower ILD layers stacked onto one another. The lower ILD structure 104L surrounds one or more lower interconnects 106. In some embodiments, the one or more lower interconnects 106 may comprise a first lower interconnect 108, a second lower interconnect 110, and a third lower interconnect 112. In some embodiments, the first lower interconnect 108 may comprise or be a conductive contact or a middle-end-of-the-line (MEOL) interconnect, the second lower interconnect 110 may comprise or be an interconnect wire, and the third lower interconnect 112 may comprise or be an interconnect via.

In some embodiments, the one or more lower interconnects 106 are coupled to a semiconductor device 114 disposed on and/or within the substrate 102. In some embodiments, the semiconductor device 114 may comprise a transistor device (e.g., a planar field effect transistor (FET), a FinFET, a gate all around (GAA) device, a nanosheet device, or the like). In other embodiments, the semiconductor device 114 may comprise a memory device (e.g., a ferroelectric field effect transistor (FeFET), a nanoparticle organic memory FET (NOMFET), or the like).

A plasma induced damage (PID) mitigation layer 116 is arranged over the lower ILD structure 104L. In some embodiments, the PID mitigation layer 116 comprises a conductive material and/or a metal. In some embodiments, the PID mitigation layer 116 may comprise a metal nitride, such as titanium nitride, tantalum nitride, or the like. In some embodiments, the PID mitigation layer 116 may comprise a metal nitride having a metal to nitrogen ratio that is greater than 1, that is between approximately 1 and approximately 1.5, that is between approximately 1 and approximately 1.1, or other similar values.

In some embodiments, a metal nitride layer 118 is disposed over the PID mitigation layer 116. One or more upper interconnects 119 are disposed within an upper ILD structure 104U disposed over the metal nitride layer 118. The one or more upper interconnects 119 may comprise a first upper interconnect 120 arranged on the one or more lower interconnects 106 and a second upper interconnect 122 disposed on the first upper interconnect 120. In some embodiments, the first upper interconnect 120 extends from between sidewalls of the PID mitigation layer 116 and/or the metal nitride layer 118 to above the PID mitigation layer 116.

In some embodiments, the PID mitigation layer 116 may be formed by a first plasma deposition process performed at a first pressure that is relatively high (e.g., greater than or equal to approximately 15 mTorr). The relatively high first pressure increases ion collisions within a first plasma of the first plasma deposition process, thereby reducing an energy of the ions and mitigating plasma induced damage caused during formation of the PID mitigation layer 116. The first pressure also causes the PID mitigation layer 116 to have a porous structure that gives the PID mitigation layer 116 a first density. In some embodiments, the porous structure includes a plurality of columnar structures.

In some embodiments, the metal nitride layer 118 may be formed using a second plasma deposition process performed at a second pressure that is less than the first pressure. The second pressure causes the metal nitride layer 118 to have a lower roughness than the PID mitigation layer 116 and a second density that is greater than the first density. The lower roughness of the metal nitride layer 118 improves a planarity of overlying layers, thereby improving a process window of the overlying layers.

The PID mitigation layer 116 is configured to prevent charged particles (e.g., ions) within a second plasma of the second plasma deposition process from flowing within the one or more lower interconnects 106. For example, in some embodiments the PID mitigation layer 116 may comprise a conductive layer that has a lower resistance than the one or more lower interconnects 106. Because the PID mitigation layer 116 has a lower resistance than the one or more lower interconnects 106, charged particles within the second plasma will flow across the PID mitigation layer 116 rather than through the one or more lower interconnects 106. By preventing charged particles within the second plasma from flowing within the one or more lower interconnects 106, the PID mitigation layer 116 reduces plasma induced damage on the semiconductor device 114.

Figure 2:
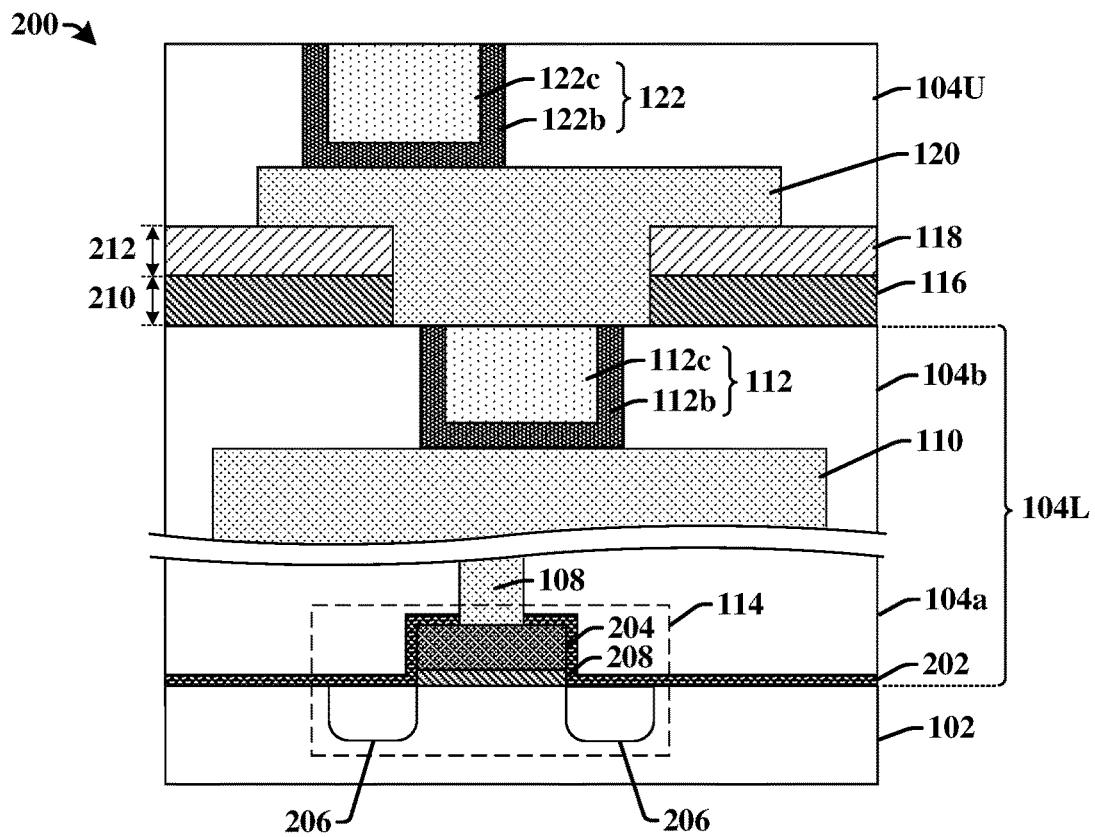
FIG. 2 illustrates a cross-sectional view of some additional embodiments of an integrated chip structure comprising a PID mitigation layer.

FIG. 2 illustrates a cross-sectional view of some additional embodiments of an integrated chip structure 200 comprising a PID mitigation layer.

The integrated chip structure 200 includes a lower ILD structure 104L disposed over a substrate 102. The lower ILD structure 104L comprises a plurality of lower dielectric layers 104a-104b stacked onto one another. In some embodiments, the plurality of lower dielectric layers 104a-104b may comprise one or more of silicon dioxide, SiCOH, borophosphate silicate glass (BSG), phosphosilicate glass (PSG), borophosphosilicate glass (BPSG), fluorosilicate glass (FSG), undoped silicate glass (USG), or the like. In some embodiments, the lower ILD structure 104L may further comprise a contact etch stop layer (CESL) 202 disposed on the substrate 102. In some embodiments, the CESL 202 may comprise one or more of a nitride (e.g., silicon nitride, silicon oxynitride, etc.), a carbide (e.g., silicon carbide, silicon oxycarbide, etc.), or the like.

The lower ILD structure 104L surrounds one or more lower interconnects 106. In some embodiments, the one or more lower interconnects 106 may comprise a first lower interconnect 108, a second lower interconnect 110, and a third lower interconnect 112. In some embodiments, the one or more lower interconnects 106 may comprise a conductive material, such as tungsten, copper, ruthenium, tantalum, titanium, or the like. In some embodiments, one or more of the one or more lower interconnects 106 may comprise a barrier layer surrounding a conductive core. For example, the third lower interconnect 112 may comprise a barrier layer 112b surrounding a conductive core 112c. In some embodiments, the barrier layer 112b may comprise a metal nitride (e.g., titanium nitride, tantalum nitride, or the like), while the conductive core 112c may comprise a metal (e.g., copper, tungsten, aluminum, or the like).

In some embodiments, the one or more lower interconnects 106 are coupled to a semiconductor device 114 disposed on and/or within the substrate 102. In some embodiments, the semiconductor device 114 may comprise a gate electrode 204 disposed laterally between source/drain regions 206. In various embodiments, the source/drain regions 206 may comprise a source or a drain, individually or collectively depending upon the context. The gate electrode 204 may be vertically separated from the substrate 102 by a gate dielectric 208. In various embodiments, the gate electrode 204 may comprise polysilicon, a metal, or the like. In some embodiments, the gate dielectric 208 may comprise an oxide (e.g., silicon oxide), a high-k dielectric material (e.g., hafnium oxide), or the like.

A PID mitigation layer 116 is disposed over the lower ILD structure 104L and a metal nitride layer 118 is arranged over the PID mitigation layer 116. In some embodiments, the PID mitigation layer 116 has a substantially flat upper surface extending between outermost sidewalls of the PID mitigation layer 116. In some embodiments, the metal nitride layer 118 has a substantially flat upper surface extending between outermost sidewalls of the metal nitride layer 118. In some embodiments, the PID mitigation layer 116 may have a first nitrogen content (e.g., in a range of between approximately 40% and approximately 50%) and the metal nitride layer 118 may have a second nitrogen content that is higher than the first nitrogen content. In some embodiments, the metal nitride layer 118 may have a lower dielectric constant than the PID mitigation layer 116.

In some embodiments, the PID mitigation layer 116 may have a first thickness 210 and the metal nitride layer 118 may have a second thickness 212. In some embodiments, a ratio of the first thickness 210 to the second thickness 212 may be in a range of between approximately 3/25 and approximately 9/15. In some embodiments, the first thickness 210 may be in a range of between approximately 25 Angstroms (Å) and approximately 100 Å, between approximately 30 Å and approximately 90 Å, greater than approximately 30 Å, or other similar values. A thickness that is less than approximately 25 Å or 30 Å may be insufficient to prevent plasma induced damage. In some embodiments, the second thickness 212 may be in a range of between approximately 100 Å and approximately 300 Å, between approximately 150 Å and approximately 250 Å, or other similar values.

A first upper interconnect 120 extends from between sidewalls of the PID mitigation layer 116 to over a top of the PID mitigation layer 116. In some embodiments, the PID mitigation layer 116 is arranged directly below peripheral regions of the first upper interconnect 120 and not directly below a central region of the first upper interconnect 120, so that the PID mitigation layer 116 is completely laterally outside of the central region of the first upper interconnect 120. A second upper interconnect 122 is arranged on the first upper interconnect 120. In some embodiments, the second upper interconnect 122 may comprise a conductive core 122c and a barrier layer 122b. In some embodiments (not shown), the first upper interconnect 120 may also comprise a barrier layer extending along sidewalls of the first upper interconnect 120 that are over the PID mitigation layer 116.

An upper ILD structure 104U laterally surrounds the first upper interconnect 120 and the second upper interconnect 122. The upper ILD structure 104U comprises one or more upper ILD layers. In some embodiments, the one or more upper ILD layers may comprise one or more of silicon dioxide, SiCOH, BSG, PSG, BPSG, FSG, USG, or the like. In some embodiments, the first upper interconnect 120 has an upper surface that is arranged directly between a lower surface of the upper ILD structure 104U and the top surface of the PID mitigation layer 116 and/or the metal nitride layer 118.

Figure 3:
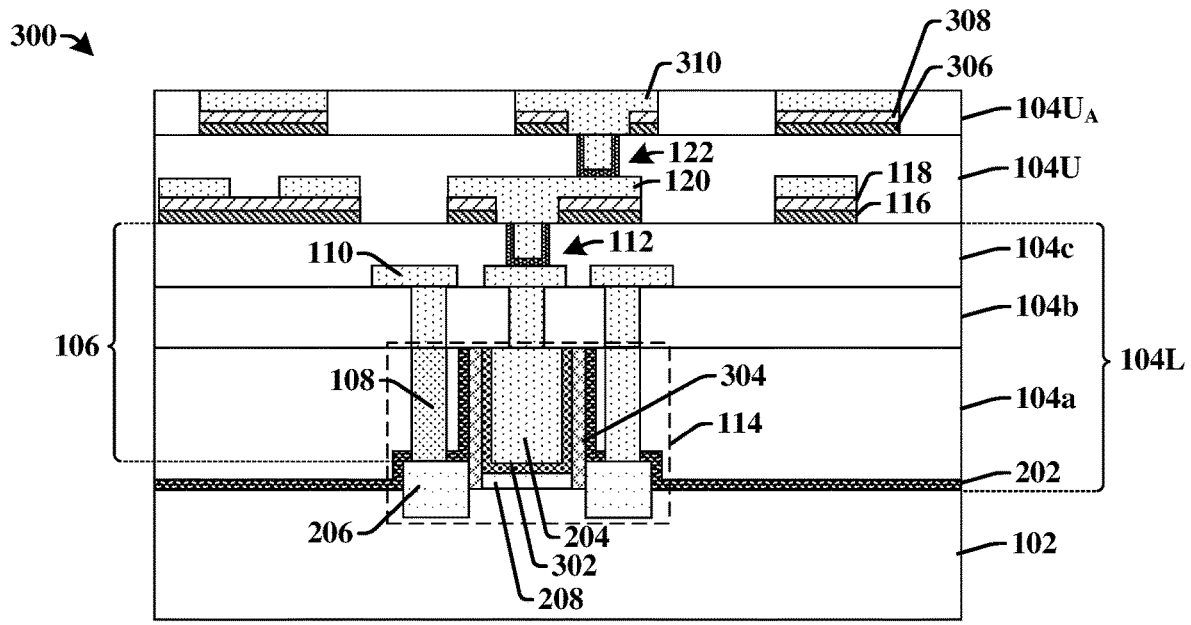
FIG. 3 illustrates a cross-sectional view of some additional embodiments of an integrated chip structure comprising a plurality of PID mitigation layers.

FIG. 3 illustrates a cross-sectional view of some additional embodiments of an integrated chip structure 300 comprising a plurality of PID mitigation layers.

The integrated chip structure 300 comprises a semiconductor device 114 disposed on and/or within a substrate 102. In some embodiments, the semiconductor device 114 may comprise a field effect transistor (FET). In some embodiments, the semiconductor device 114 may comprise a ferroelectric field effect transistor (FeFET) device. In such embodiments, the semiconductor device 114 comprises a gate electrode 204 disposed between source/drain regions 206. The gate electrode 204 is separated from the substrate 102 by a gate dielectric 208. The gate electrode 204 is further separated from the gate dielectric 208 by a ferroelectric layer 302. In some embodiments, the ferroelectric layer 302 may extend along a lower surface and along sidewalls of the gate electrode 204. In various embodiments, the ferroelectric layer 302 may be or comprise hafnium oxide, hafnium-zirconium-oxide (e.g., $Hf_xZr_{1-x}O_y$, $Hf_{0.5}Zr_{0.5}O_2$, etc.), aluminum nitride doped with scandium, hafnium-zirconium-oxide doped with one or more dopants (e.g., aluminum, silicon, lanthanum, scandium, calcium, barium, gadolinium, yttrium, another suitable dopant, or any combination of the foregoing), beryllium oxide, zinc oxide, calcium oxide, strontium oxide, boron oxide, zirconium dioxide, or the like. In some embodiments, sidewall spacers 304 may be arranged along opposing sides of the ferroelectric layer 302.

A plurality of lower interconnects 106 are arranged within a lower ILD structure 104L comprising a plurality of stacked lower ILD layers 104a-104c. The plurality of lower interconnects 106 are coupled to the semiconductor device 114. A PID mitigation layer 116 is arranged over the lower ILD structure 104L and a metal nitride layer 118 is arranged over the PID mitigation layer 116. A first upper interconnect 120 extends through the PID mitigation layer 116 and the metal nitride layer 118 to over the metal nitride layer 118. A second upper interconnect 122 is arranged on the first upper interconnect 120. An upper ILD structure 104U is arranged around the first upper interconnect 120 and the second upper interconnect 122.

In some embodiments, the PID mitigation layer 116 and the metal nitride layer 118 may comprise a plurality of discrete segments that are laterally separated from one another by the upper ILD structure 104U. By separating the discrete segments of the PID mitigation layer 116 and the metal nitride layer 118 from one another, the plurality of upper interconnects 119 are electrically isolated from one another. In some embodiments, the PID mitigation layer 116 and the metal nitride layer 118 may comprise segments that are completely confined below the first upper interconnect 120. In some embodiments, the PID mitigation layer 116 and the metal nitride layer 118 may comprise segments that laterally extend past an outermost sidewall of the first upper interconnect 120. In some embodiments, the PID mitigation layer 116 and the metal nitride layer 118 may comprise segments that continuously extend between two adjacent ones of the plurality of upper interconnects 119. In such embodiments, the two adjacent ones of the plurality of upper interconnects 119 are electrically coupled together.

An additional PID mitigation layer 306 is arranged over the upper ILD structure 104U and an additional metal nitride layer 308 is arranged over the additional PID mitigation layer 306. A third upper interconnect 310 extends through the additional PID mitigation layer 306 and the additional metal nitride layer 308 to over the additional metal nitride layer 308. An additional upper ILD structure 104U$_A$ is arranged around the third upper interconnect 310.

Figure 4:
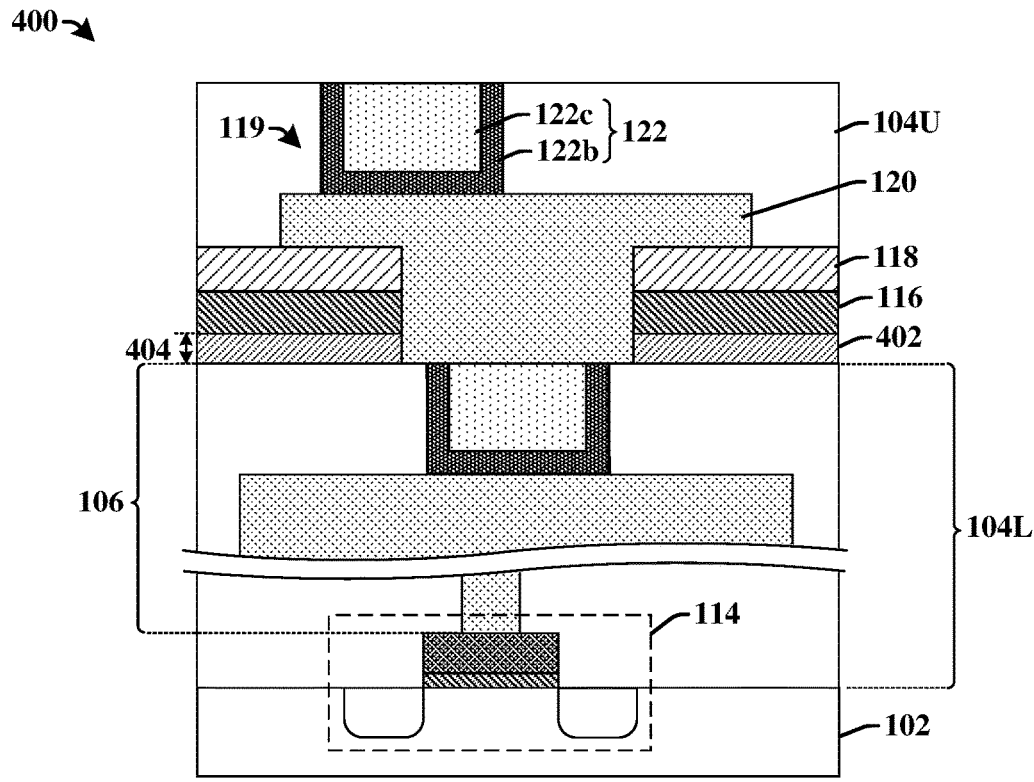
FIG. 4 illustrates a cross-sectional view of some additional embodiments of an integrated chip structure comprising a PID mitigation layer.

FIG. 4 illustrates a cross-sectional view of some additional embodiments of an integrated chip structure 400 comprising a PID mitigation layer.

The integrated chip structure 400 includes a lower ILD structure 104L disposed over a substrate 102. The lower ILD structure 104L surrounds one or more lower interconnects 106 that are coupled to a semiconductor device 114 (e.g., a field effect transistor) disposed on or within the substrate 102. A dielectric layer 402 is arranged over the lower ILD structure 104L. The dielectric layer 402 may comprise an oxide (e.g., silicon oxide), a nitride (e.g., silicon nitride, silicon oxynitride, etc.), a carbide (e.g., silicon carbide, silicon oxycarbide, etc.), or the like.

The dielectric layer 402 has a thickness 404. In some embodiments, a ratio of the thickness 404 to a thickness of the PID mitigation layer 116 is in a range of between approximately ½ and approximately 7. In some embodiments, the dielectric layer 402 may have a thickness 404 that is in a range of between approximately 50 Angstroms (Å) and approximately 200 Å, between approximately 100 Å and approximately 150 Å, or other similar values. A PID mitigation layer 116 is arranged over the dielectric layer 402 and a metal nitride layer 118 is disposed over the PID mitigation layer 116

The dielectric layer 402 may be formed using a plasma deposition process that has a relatively low power. For example, in some embodiments the dielectric layer 402 may be formed at a power that is less than or equal to a power used to form the PID mitigation layer 116. The low power of the plasma deposition process allow for the dielectric layer 402 to be formed without causing plasma induced damage on the semiconductor device 114.

One or more upper interconnects 119 are disposed within an upper ILD structure 104U disposed over the metal nitride layer 118. The one or more upper interconnects 119 comprise a first upper interconnect 120 and a second upper interconnect 122. The first upper interconnect 120 extends through the dielectric layer 402, the PID mitigation layer 116, and the metal nitride layer 118 to contact the one or more lower interconnects 106. In some embodiments, the dielectric layer 402 may be configured to act as an etch stop layer used during formation of the first upper interconnect 120.

Figure 5A:
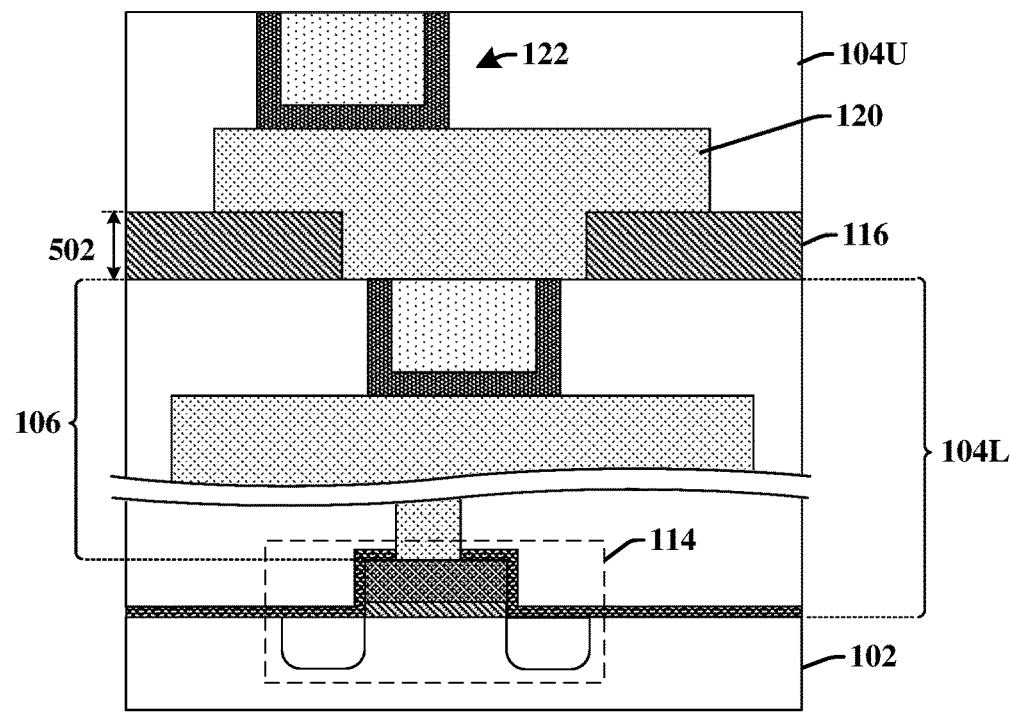
FIGS. 5A-5B illustrate cross-sectional views of some additional embodiments of integrated chip structures comprising a PID mitigation layer.

FIG. 5A illustrates a cross-sectional view of some additional embodiments of an integrated chip structure 500 comprising a PID mitigation layer.

The integrated chip structure 500 includes a lower ILD structure 104L disposed over a substrate 102. The lower ILD structure 104L surrounds one or more lower interconnects 106 that are coupled to a semiconductor device 114 disposed on or within the substrate 102.

A PID mitigation layer 116 is arranged over the lower ILD structure 104L. A first upper interconnect 120 extends through the PID mitigation layer 116. In some embodiments, the first upper interconnect 120 may extend from a lower surface contacting the one or more lower interconnects 106, to directly between sidewalls of the PID mitigation layer 116, and to directly over the PID mitigation layer 116. In some embodiments, the first upper interconnect 120 contacts the sidewalls and the upper surface of the PID mitigation layer 116. In some embodiments, the PID mitigation layer 116 may have a thickness 502 that is in a range of between approximately 100 Å and approximately 500 Å, between approximately 200 Å and approximately 400 Å, or other similar values.

Having the first upper interconnect 120 contact sidewalls and the upper surface of the PID mitigation layer 116 allows for the integrated chip structure 500 to be formed using a relatively simple fabrication process (e.g., excluding a further deposition process to form a metal nitride layer) that can reduce fabrication costs relative to the structure shown in FIG. 1, for example. However, because the PID mitigation layer 116 is formed by a plasma deposition process performed at a high pressure, the PID mitigation layer 116 will reduce plasma induced damage on the semiconductor device 114.

Figure 5B:
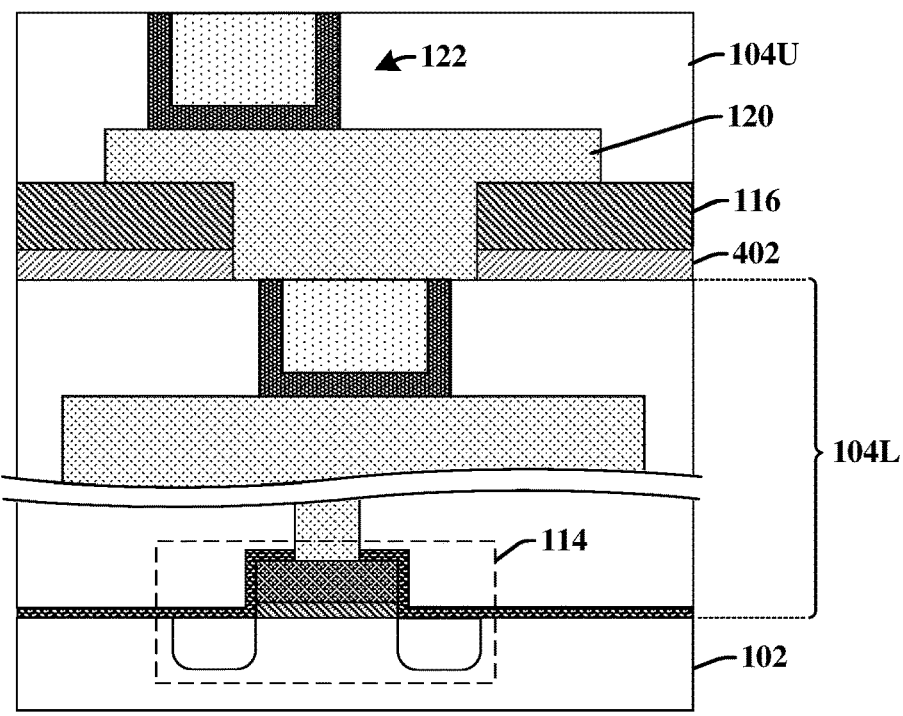

FIG. 5B illustrates a cross-sectional view of some additional embodiments of an integrated chip structure 504 comprising a PID mitigation layer.

The integrated chip structure 504 includes a dielectric layer 402 disposed between the PID mitigation layer 116 and the lower ILD structure 104L. The first upper interconnect 120 extends through the PID mitigation layer 116 and the dielectric layer 402.

Figure 6:
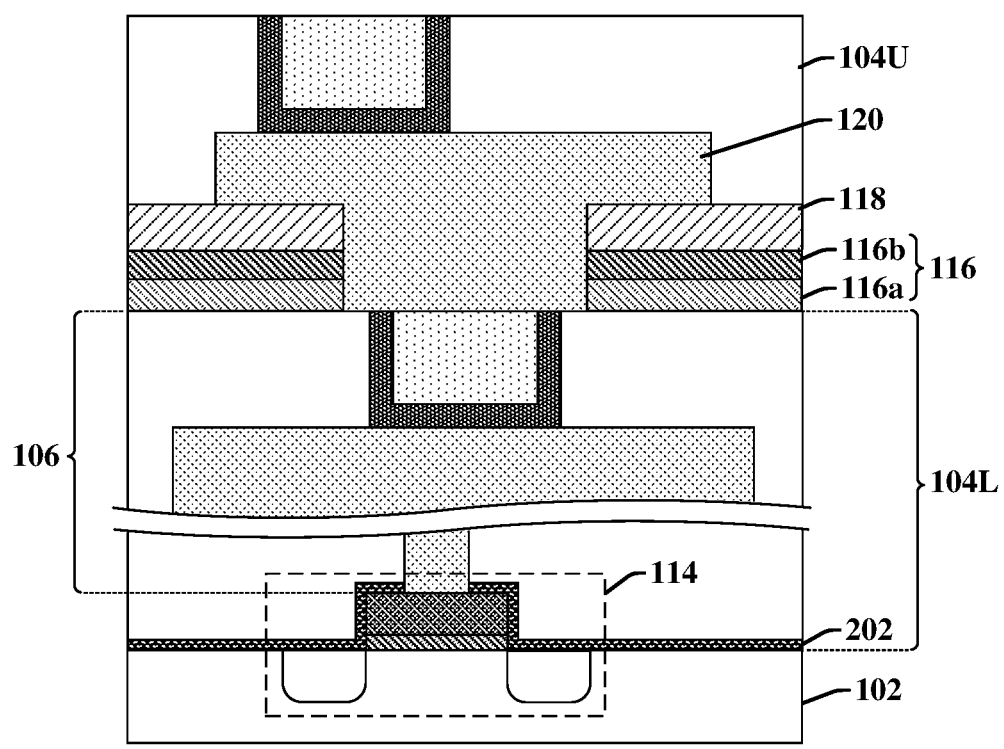
FIG. 6 illustrates a cross-sectional view of some additional embodiments of an integrated chip structure comprising a PID mitigation layer having a plurality of sub-layers.

FIG. 6 illustrates a cross-sectional view of some additional embodiments of an integrated chip structure 600 comprising a PID mitigation layer.

The integrated chip structure 600 includes a lower ILD structure 104L disposed over a substrate 102. The lower ILD structure 104L surrounds one or more lower interconnects 106 that are coupled to a semiconductor device 114 disposed on or within the substrate 102.

A PID mitigation layer 116 is arranged over the lower ILD structure 104L. In some embodiments, a lower surface of the PID mitigation layer 116 may have a first concentration of nitrogen, while an upper surface of the PID mitigation layer 116 may have a second concentration of nitrogen that is different than (e.g., larger than) the first concentration. In some embodiments, the PID mitigation layer 116 may have a gradient concentration that continuously increases from the lower surface to the upper surface. In other embodiments, the PID mitigation layer 116 may comprise a plurality of different PID mitigation sub-layers 116a-116b respectively having different nitrogen concentrations. In such embodiments, the overall concentration of the PID mitigation layer 116 may increase in a step-wise manner between the different nitrogen concentrations of the different PID mitigation sub-layers 116a-116b.

In some embodiments, the plurality of different PID mitigation sub-layers 116a-116b may comprise a first PID mitigation sub-layer 116a and a second PID mitigation sub-layer 116b. The first PID mitigation sub-layer 116a has a first nitrogen concentration and the second PID mitigation sub-layer 116b has a second nitrogen concentration that is greater than the first nitrogen concentration. For example, the first nitrogen concentration may be in a range of between approximately 40% and approximately 45%, while the second nitrogen concentration may be in a range of between approximately 45% and approximately 50%.

In some embodiments, a metal nitride layer 118 is arranged over the PID mitigation layer 116. In some embodiments, the metal nitride layer 118 may have a higher nitrogen concentration than a maximum nitrogen concentration of the PID mitigation layer 116. A first upper interconnect 120 is arranged on the metal nitride layer 118 and extends from over the metal nitride layer 118 to the one or more lower interconnects 106.

Figure 7:
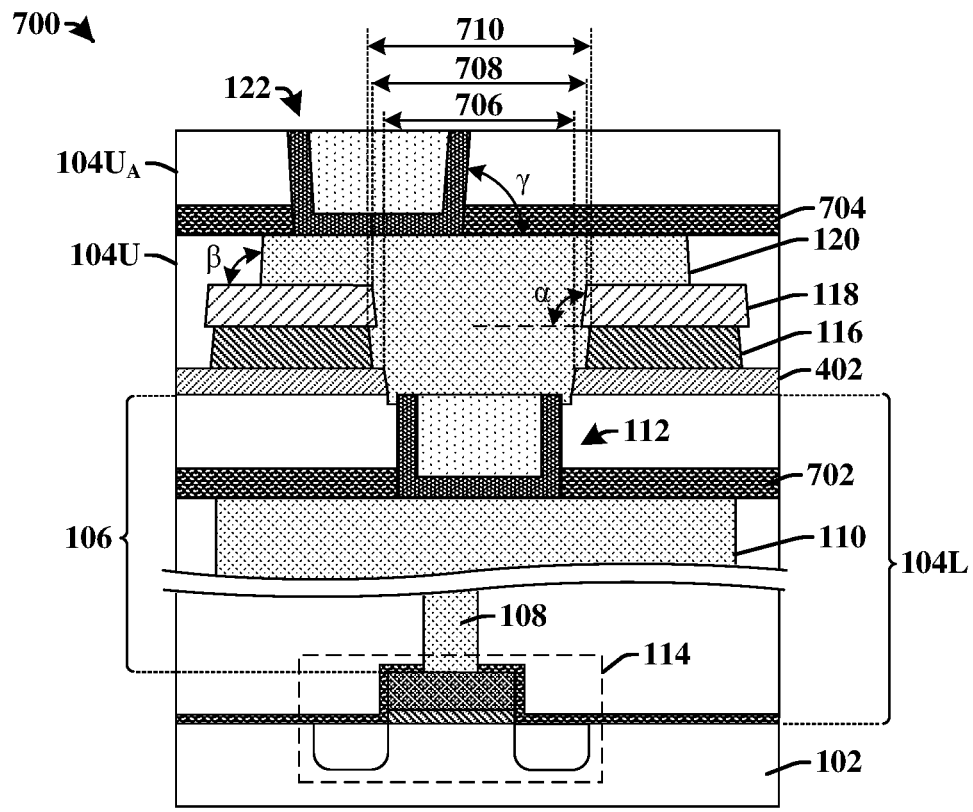
FIG. 7 illustrates a cross-sectional view of some additional embodiments of an integrated chip structure comprising a PID mitigation layer.

FIG. 7 illustrates a cross-sectional view of some additional embodiments of an integrated chip structure 700 comprising a PID mitigation layer.

The integrated chip structure 700 includes a lower ILD structure 104L disposed over a substrate 102. The lower ILD structure 104L surrounds one or more lower interconnects 106 that are coupled to a semiconductor device 114 disposed on or within the substrate 102. The one or more lower interconnects 106 comprise a first lower interconnect 108, a second lower interconnect 110, and a third lower interconnect 112. In some embodiments, a lower etch stop layer 702 may be arranged along a top of the second lower interconnect 110. The third lower interconnect 112 may extend through the lower etch stop layer 702 to contact the second lower interconnect 110. In some embodiments, the lower etch stop layer 702 may comprise one or more of a nitride (e.g., silicon nitride, silicon oxynitride, etc.), a carbide (e.g., silicon carbide, silicon oxycarbide, etc.), or the like.

A dielectric layer 402 is arranged over the lower ILD structure 104L, a PID mitigation layer 116 is arranged over the dielectric layer 402, and a metal nitride layer 118 is arranged over the PID mitigation layer 116. A first upper interconnect 120 extends through the dielectric layer 402, the PID mitigation layer 116, and the metal nitride layer 118 to contact the one or more lower interconnects 106. A second upper interconnect 122 is arranged on the first upper interconnect 120. In some embodiments, an upper etch stop layer 704 may be arranged along an upper surface of the first upper interconnect 120. The second upper interconnect 122 extends through the upper etch stop layer 704 to contact the first upper interconnect 120. In some embodiments, the upper etch stop layer 704 may comprise one or more of a nitride (e.g., silicon nitride, silicon oxynitride, etc.), a carbide (e.g., silicon carbide, silicon oxycarbide, etc.), or the like.

In some embodiments, the first upper interconnect 120 may have lower sidewalls that are arranged between sidewalls of the PID mitigation layer 116 and upper sidewalls that are disposed over the PID mitigation layer 116. In some embodiments, the lower sidewalls that are angled at a first angle $\alpha$ with respect to a horizontal line that is parallel to a top of the substrate 102. The first angle $\alpha$ of the lower sidewalls causes a lower portion of the first upper interconnect 120 to have a width that increases as a distance from the substrate 102 increases. In some embodiments, the upper sidewalls are angled at a second angle $\beta$ with respect to a top surface of the metal nitride layer 118. The second angle $\beta$ of the upper sidewalls causes an upper portion of the first upper interconnect 120 to have a width that decreases as a distance from the substrate 102 increases. In some embodiments, the second upper interconnect 122 may have sidewalls that are angled at a third angle $\gamma$ with respect to an upper surface of the first upper interconnect 122. The third angle $\gamma$ of the sidewalls causes the second upper interconnect 122 to have a width that decreases as a distance from the substrate 102 decreases.

In some embodiments, the first upper interconnect 120 may have different widths directly between sidewalls of the dielectric layer 402, sidewalls of the PID mitigation layer 116, and sidewalls of the metal nitride layer 118. For example, the first upper interconnect 120 may have a first width 706 directly between the sidewalls of the dielectric layer 402, a second width 708 directly between the sidewalls of the PID mitigation layer 116, and a third width 710 directly between the sidewalls of the metal nitride layer 118.

It will be appreciated that while the disclosed PID mitigation layer illustrated in FIGS. 1-7 reduces the flow of charged particles through exposed surfaces of the one or more lower interconnects, that plasma induced damage may also occur in integrated chip structures that have a dielectric layer (e.g., an etch stop layer) covering the one or more lower interconnects. For example, forming a metal onto a dielectric layer that is over a lower interconnect may form a MIM (metal-insulator-metal) structure that is capacitively coupled to the one or more lower interconnects (e.g., that has a capacitance that causes charged particles to form within the one or more lower interconnects). The capacitive coupling can stress a gate dielectric of an underlying semiconductor device, thereby leading to plasma induced damage. The extent of plasma induced damage in such MIM structures may increase as a size of metal above and/or below a dielectric layer increases (since capacitance is proportional to a size of a conductive structure).

Figure 8:
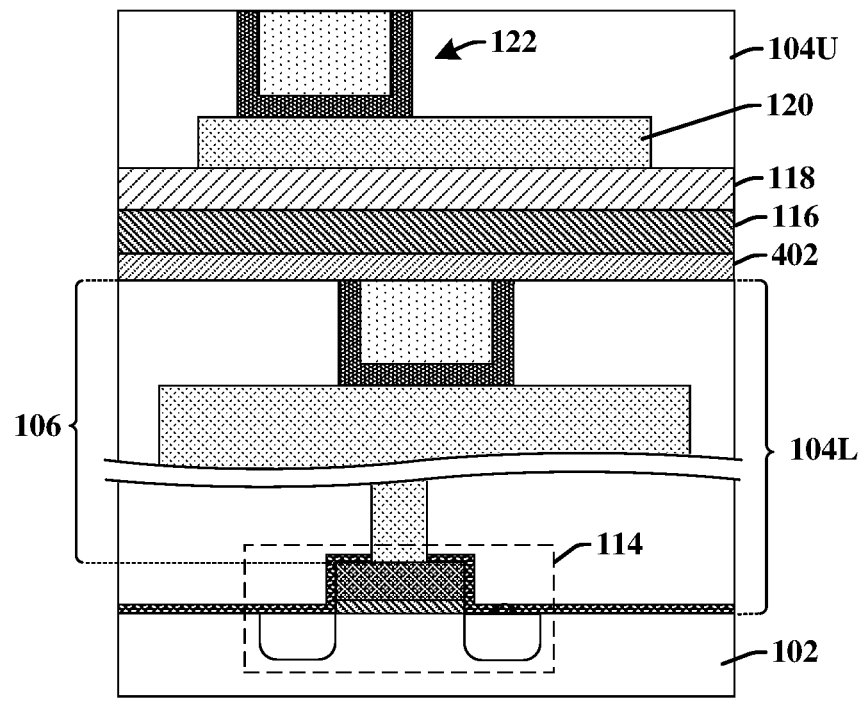
FIG. 8 illustrates a cross-sectional view of some additional embodiments of an integrated chip structure comprising a MIM structure having a PID mitigation layer.

In some embodiments, the disclosed PID mitigation layer may also be used in MIM structures to prevent plasma induced damage in underlying semiconductor devices. For example, FIG. 8 illustrates a cross-sectional view of some additional embodiments of an integrated chip structure 800 comprising a PID mitigation layer configured to reduce plasma induced damage on a MIM structure.

The integrated chip structure 800 includes a lower ILD structure 104L disposed over a substrate 102. The lower ILD structure 104L surrounds one or more lower interconnects 106 that are coupled to a semiconductor device 114 disposed on or within the substrate 102. A PID mitigation layer 116 is arranged over the lower ILD structure 104L. In some embodiments, a dielectric layer 402 may be arranged between the PID mitigation layer 116 and the lower ILD structure 104L. In some embodiments, a metal nitride layer 118 may be arranged over the PID mitigation layer 116. A first upper interconnect 120 is arranged entirely over a top of the PID mitigation layer 116 and/or a top of the metal nitride layer 118, as viewed in the cross-sectional view. A second upper interconnect 122 may be arranged on the first upper interconnect 120.

The first upper interconnect 120 is separated from the one or more lower interconnects 106 by the dielectric layer 402, the PID mitigation layer 116, and/or the metal nitride layer 118. Without the PID mitigation layer 116, a plasma deposition process used to form the first upper interconnect 120 could capacitively couple to the one or more lower interconnects 106, resulting in plasma induced damage on the semiconductor device 114. However, the PID mitigation layer 116 mitigates capacitive coupling between the one or more lower interconnects 106 and the first upper interconnect 120, thereby mitigating plasma induced damage on the semiconductor device 114.

It will be appreciated that different ones of the PID mitigation film schemes illustrated in FIGS. 1-8 may be integrated within a same integrated chip structure. Integrating the different PID mitigation film schemes allows for flexibility of design, costs, and/or reliability. For example, in some embodiments lower interconnects may utilize a metal nitride layer to improve planarity while overlying interconnects may not utilize a metal nitride layer to improve cost and throughput (e.g., since process tolerances may be less stringent at higher interconnects).

Figure 9:
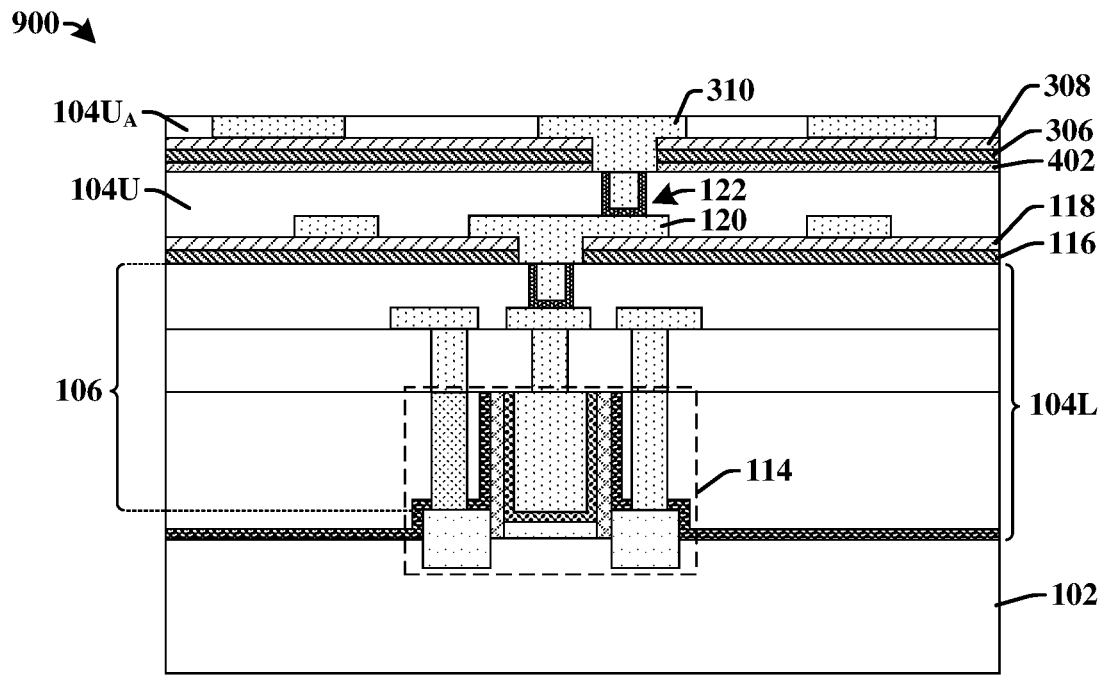
FIG. 9 illustrates a cross-sectional view of some additional embodiments of an integrated chip structure comprising a plurality of PID mitigation layers.

FIG. 9 illustrates a cross-sectional view of some additional embodiments of an integrated chip structure comprising a plurality of PID mitigation layers.

The integrated chip structure 900 comprises a PID mitigation layer 116 arranged over a lower ILD structure 104L surrounding one or more lower interconnects 106 coupled to a semiconductor device 114 disposed on and/or within a substrate 102. A metal nitride layer 118 is arranged on the PID mitigation layer 116. A first upper interconnect 120 extends through the PID mitigation layer 116 and the metal nitride layer 118 to over the metal nitride layer 118. A second upper interconnect 122 is arranged on the first upper interconnect 120. An upper ILD structure 104U is arranged around the first upper interconnect 120 and the second upper interconnect 122.

A dielectric layer 402 is arranged over the upper ILD structure 104U, an additional PID mitigation layer 306 is arranged over the dielectric layer 402, and an additional metal nitride layer 308 is arranged over the additional PID mitigation layer 306. A third upper interconnect 310 extends through the dielectric layer 402, the additional PID mitigation layer 306, and the additional metal nitride layer 308 to over the additional metal nitride layer 308. An additional upper ILD structure $104U_A$ is arranged around the third upper interconnect 310. In some embodiments, the PID mitigation layer 116 and the additional PID mitigation layer 306 may comprise a same material (e.g., a same metal nitride). In other embodiments, the PID mitigation layer 116 and the additional PID mitigation layer 306 may comprise different materials (e.g., different metal nitrides).

Figure 10A:
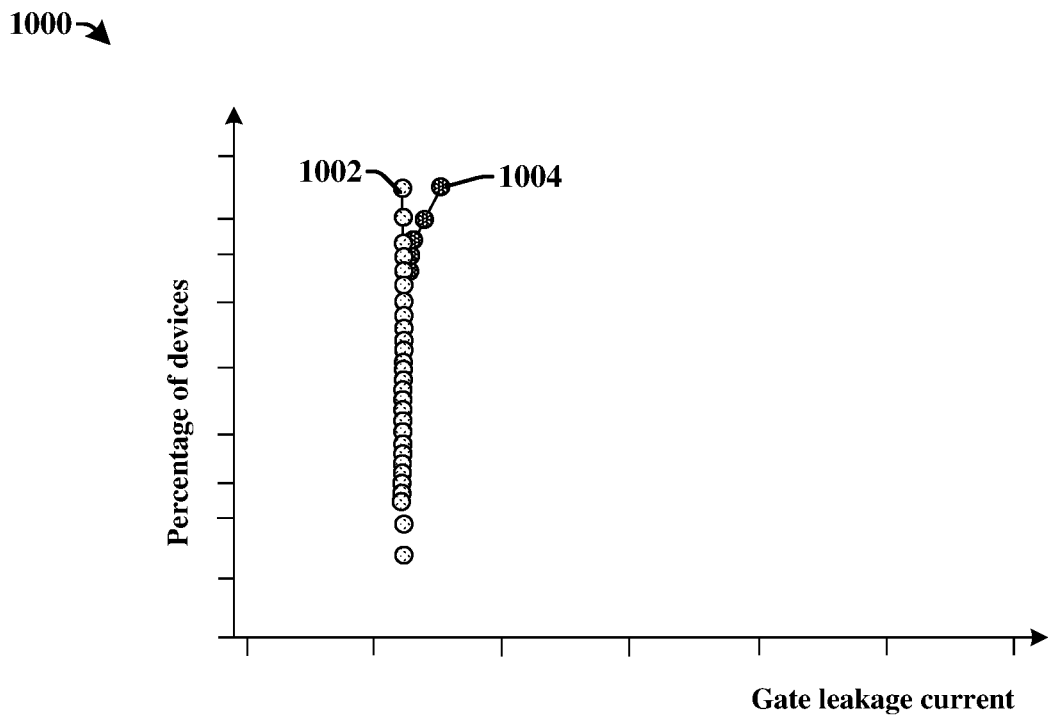
FIGS. 10A-10B illustrate graphs showing exemplary gate leakage currents for transistor devices on an integrated chip structure having a disclosed PID mitigation layer.
Figure 10B:
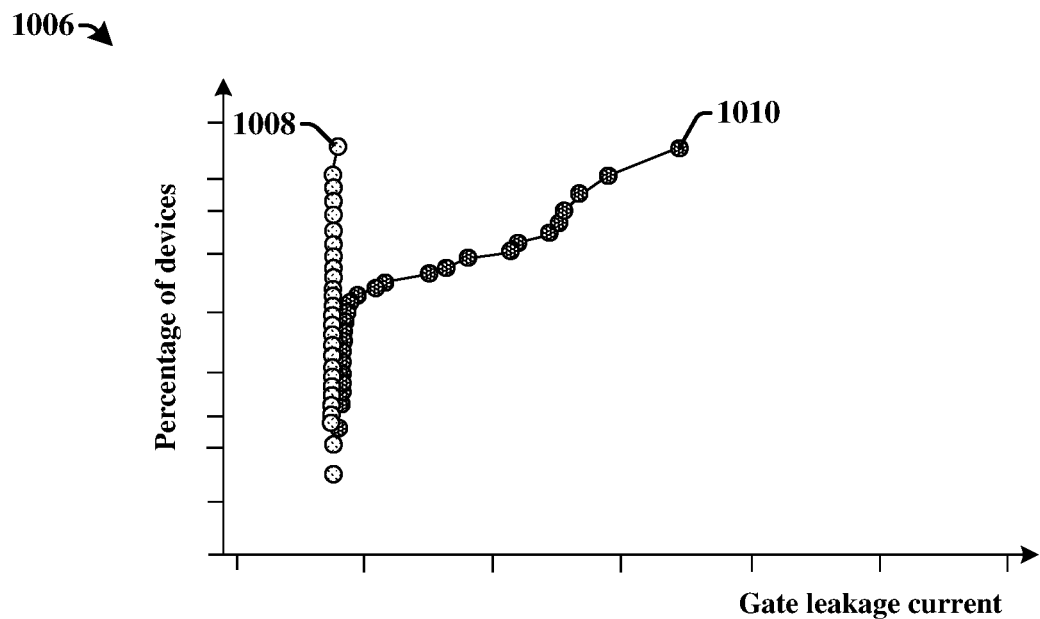

FIGS. 10A-10B illustrate graphs, 1000 and 1006, showing some embodiments of exemplary gate leakage currents for transistor devices on a semiconductor body.

Metal interconnect routing builds an antenna structure over FEOL devices (e.g., transistor devices. The antenna structures allow for charges to go through the interconnects and towards the FEOL devices, thereby applying an unwanted gate voltage to a gate electrode of the FEOL devices. The unwanted gate voltage can degrade a quality of a gate dielectric, thereby resulting in a high gate leakage current due to PID effect. FIG. 10A illustrates a graph 1000 showing some embodiments of exemplary gate leakage currents for NMOS devices on a semiconductor body (e.g., a die, a wafer, or the like).

In graph 1000, the x-axis illustrates a gate leakage current value. The y-axis illustrates a percent of devices that have different gate leakage currents. A gate leakage current 1002 for transistor devices of integrated chip structures not having a disclosed PID mitigation layer is substantially constant for most devices on a semiconductor body. However, the gate leakage current 1002 increases for some transistor devices (e.g., for about 3% to about 10% of transistor devices on the semiconductor body, for about 3% to about 5% of transistor devices, for about 3% of transistor devices, or other similar values). In contrast, a gate leakage current 1004 for devices of integrated chip structures having a disclosed PID mitigation layer is substantially constant for substantially all transistor devices on a semiconductor body (e.g., for less than approximately 1% of transistor devices on the semiconductor body). Therefore, the disclosed PID mitigation layer decreases gate leakage currents for NMOS devices over a semiconductor body (e.g., for about 3% to about 10% of transistor devices, for about 3% to about 5% of transistor devices, for about 3% of transistor devices, or other similar values).

FIG. 10B illustrates a graph 1006 showing some embodiments of exemplary gate leakage currents for PMOS devices on a semiconductor body.

In graph 1006, the x-axis illustrates a gate leakage current value. The y-axis illustrates a percent of devices that have different gate leakage currents. A gate leakage current 1008 for devices of integrated chip structures not having a disclosed PID mitigation layer increases for some transistor devices (e.g., for about 40% to about 50% of transistor devices on a semiconductor body, for about 45% to about 50% of transistor devices, for about 47% of transistor devices, or other similar values). In contrast, a gate leakage current 1010 for devices of integrated chip structures having a disclosed PID mitigation layer is substantially constant for substantially all devices on a semiconductor body (e.g., for less than approximately 2% of transistor devices on the semiconductor body, for less than approximately 1% of transistor devices, or other similar values). Therefore, the disclosed PID mitigation layer decreases gate leakage currents for PMOS devices over a semiconductor body (e.g., for about 40% to about 50% of transistor devices on a semiconductor body, for about 45% to about 50% of transistor devices, for about 47% of transistor devices, or other similar values).

FIGS. 11-20 illustrate cross-sectional views 1100-2000 of some embodiments of a method of forming an integrated chip structure comprising a disclosed PID mitigation layer. Although FIGS. 11-20, 21-28, 29-34, 35-42, and 43-50 are described in relation to methods, it will be appreciated that the structures disclosed in the methods are not limited to such methods, but instead may stand alone as structures independent of the methods.

Figure 11:
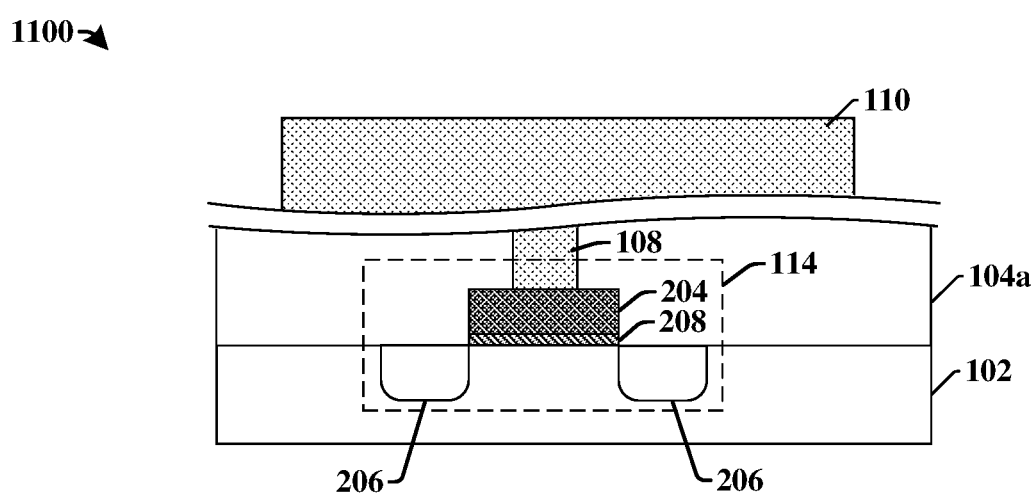
FIGS. 11-20 illustrate some embodiments of a method of forming an integrated chip structure comprising a PID mitigation layer.

As shown in cross-sectional view 1100 of FIG. 11, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, one or more semiconductor devices 114 are formed on and/or within the substrate 102. In some embodiments, forming the one or more semiconductor devices 114 includes forming a gate dielectric film over the substrate 102, forming a gate electrode film over the gate dielectric film, and selectively patterning the gate dielectric film and the gate electrode film according to an etching process to form a gate electrode 204 separated from the substrate 102 by a gate dielectric 208. Source/drain region 206 can be subsequently implanted into the substrate 102 on opposing sides of the gate electrode 204.

A first lower interconnect 108 is formed over the substrate 102. In some embodiments, the first lower interconnect 108 may be formed using a damascene process (e.g., a single damascene process or a dual damascene process). The damascene process is performed by forming a first lower ILD layer 104a over the substrate 102, etching the first lower ILD layer 104a to form a hole and/or a trench, and filling the hole and/or trench with a conductive material. In some embodiments, the first lower ILD layer 104a may be deposited by a deposition process (e.g., a physical vapor deposition (PVD) process, a chemical vapor deposition (CVD) process, a plasma enhanced CVD (PE-CVD) process, or the like) and the conductive material may be formed using a deposition process and/or a plating process (e.g., electro-plating, electro-less plating, etc.). In various embodiments, the first lower interconnect 108 may comprise tungsten, copper, or aluminum copper, or the like.

A second lower interconnect 110 is formed over the first lower interconnect 108. In some embodiments, the second lower interconnect 110 may be formed by depositing a conductive material over the substrate 102 and by subsequently etching the conductive material to form the second lower interconnect 110. In other embodiments (not shown), the second lower interconnect 110 may be formed by way of a damascene process.

Figure 12:
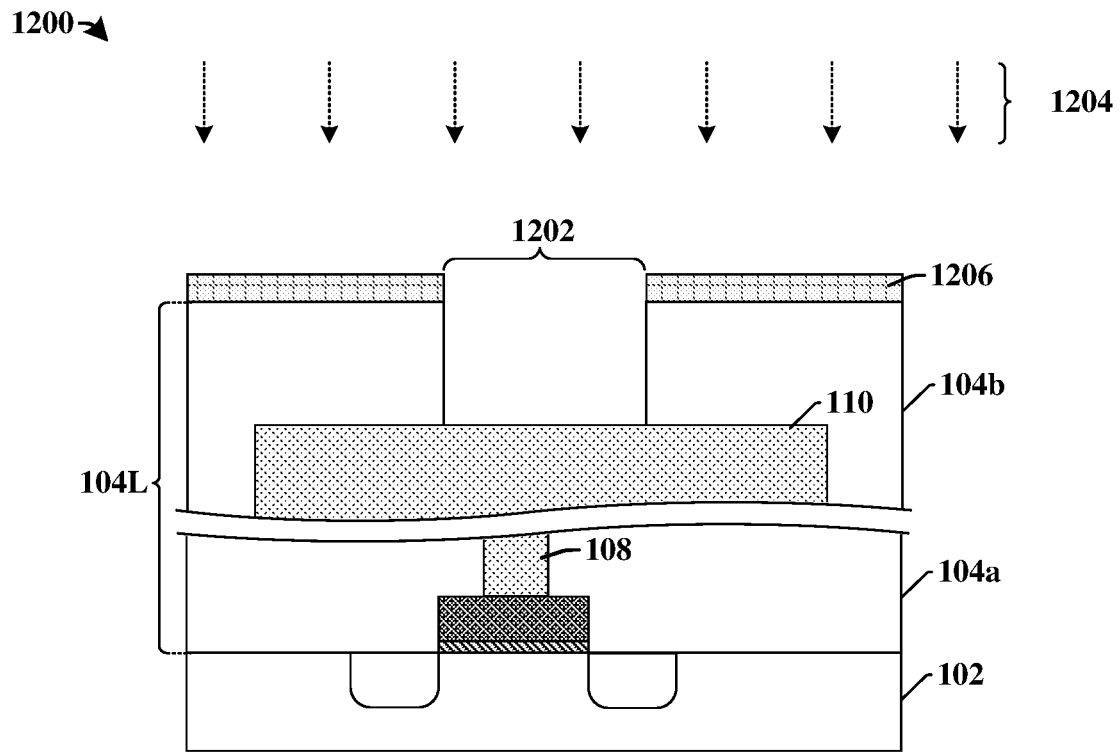

As shown in cross-sectional view 1200 of FIG. 12, a second lower ILD layer 104b is formed on and/or over the second lower interconnect 110 to form a lower ILD structure 104L. In some embodiments, the second lower ILD layer 104b may extend from around the second lower interconnect 110 to over the second lower interconnect 110. The second lower ILD layer 104b may be formed by a deposition process (e.g., a PVD process, a CVD process, a PE-CVD process, an ALD process, or the like).

The lower ILD structure 104L is subsequently patterned to form a lower interconnect opening 1202 exposing an upper surface of the second lower interconnect 110. In some embodiments, the lower ILD structure 104L may be patterned by selectively exposing the lower ILD structure 104L to a first etchant 1204 according to a first mask 1206.

Figure 13:
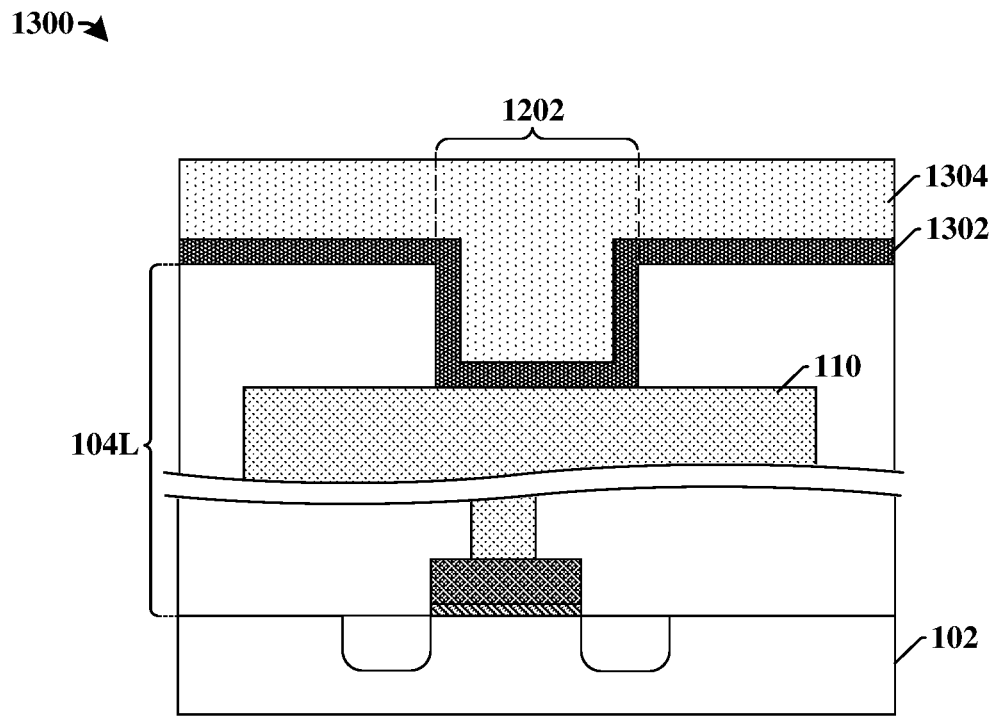

As shown in cross-sectional view 1300 of FIG. 13, a first diffusion barrier layer 1302 is formed over the lower ILD structure 104L and within the lower interconnect opening 1202. The first diffusion barrier layer 1302 may be formed by a deposition process (e.g., a PVD process, a CVD process, a PE-CVD process, an ALD process, or the like). A first conductive material 1304 is formed onto the first diffusion barrier layer 1302 and within the lower interconnect opening 1202. The first conductive material 1304 may be formed by a deposition process (e.g., a PVD process, a CVD process, a PE-CVD process, or the like) and/or by a plating process (e.g., electroplating, electro-less plating, etc.).

Figure 14:
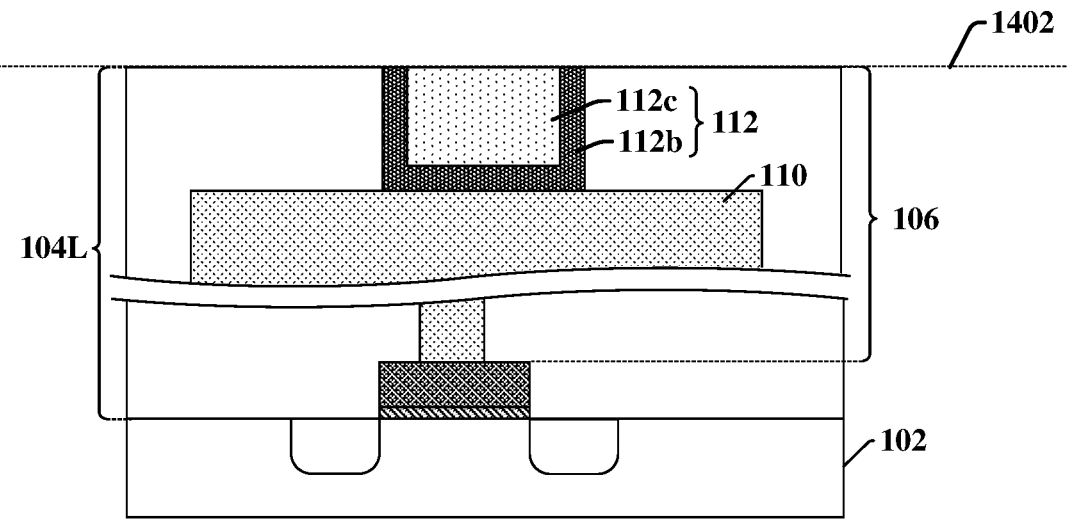

As shown in cross-sectional view 1400 of FIG. 14, a planarization process is performed (along line 1402) to remove parts of the first conductive material (e.g., 1304 of FIG. 13) and the first diffusion barrier layer (e.g., 1302 of FIG. 13) from over the lower ILD structure 104L. By removing parts of the first conductive material and the first diffusion barrier layer, the planarization process forms a third lower interconnect 112 comprising a barrier layer 112b and a conductive core 112c. In some embodiments, the planarization process may comprise a chemical mechanical planarization (CMP) process, a wet etching process, a dry etching process, a mechanical grinding process, or the like.

Figure 15A:
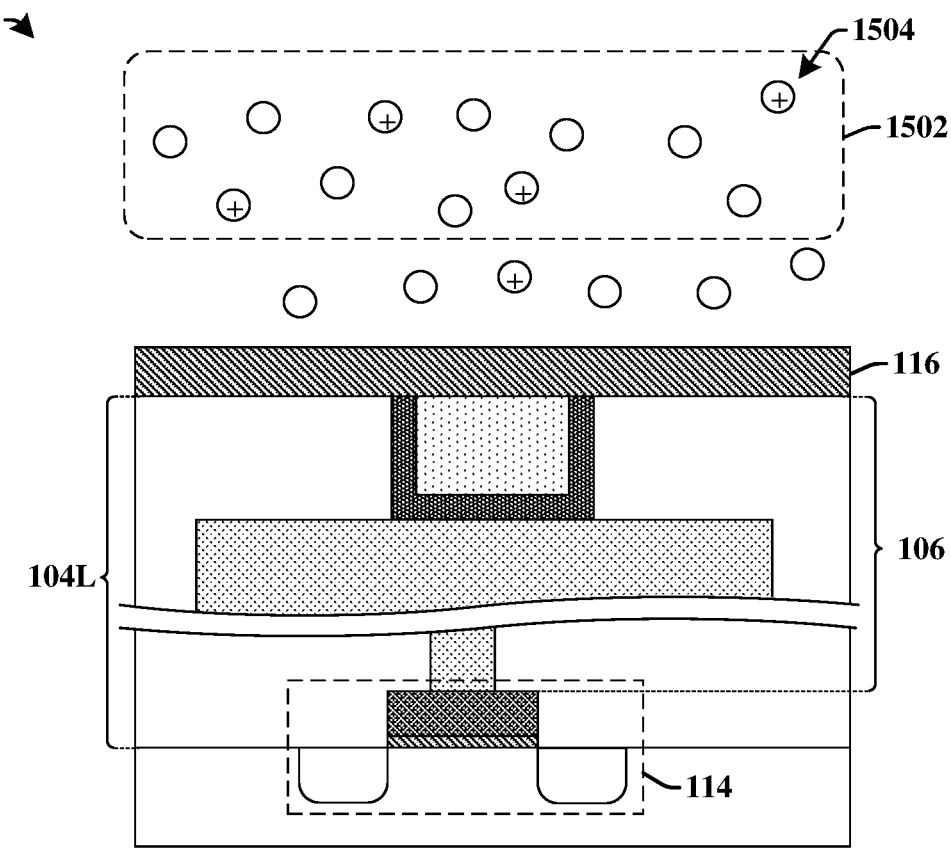

As shown in cross-sectional view 1500 of FIG. 15A, a PID mitigation layer 116 is formed onto the lower ILD structure 104L. The PID mitigation layer 116 comprises a metal film. In some embodiments, the PID mitigation layer 116 may comprise a metal nitride, such as titanium nitride, tantalum nitride, or the like. In some embodiments, the PID mitigation layer 116 may be formed by a first plasma deposition process (e.g., a plasma enhanced PVD process, a plasma enhanced CVD process, a plasma sputtering process, or the like) performed at a first pressure. In such embodiments, the first pressure increases a number of collisions between charged particles 1504 of a plasma 1502. The collisions reduce an energy of the charged particles 1504, thereby reducing a charging effect that the charged particles 1504 have on the one or more lower interconnects 106 and reducing plasma induced damage on the semiconductor device 114. The first pressure also gives the PID mitigation layer 116 a first nitrogen content.

In some embodiments, the PID mitigation layer 116 may be formed at a sputtering gas pressure (e.g., at an argon sputtering gas pressure) of greater than approximately 20 mTorr, greater than approximately 15 mTorr, or the like. In some embodiments, the PID mitigation layer 116 may be formed over a time of between approximately 100 seconds and approximately 750 seconds, between approximately 200 seconds and approximately 700 seconds, or other similar values. Forming the PID mitigation layer 116 over such times results in the PID mitigation layer 116 having a metal to nitrogen ratio that is greater than 1, that is between approximately 1 and approximately 1.1, that is equal to approximately 1.1, or other similar values.

Figure 15B:
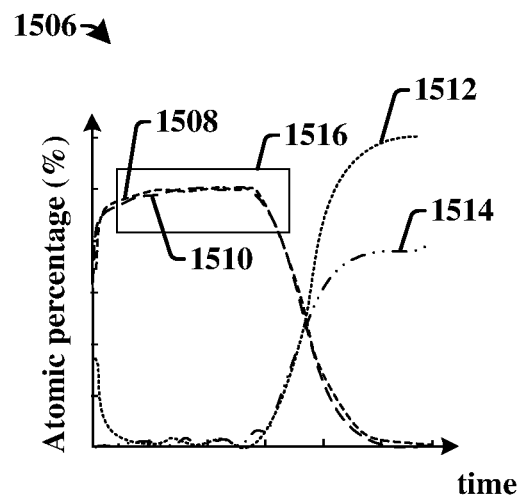

For example, FIG. 15B illustrates a graph 1506 showing an exemplary content of a PID mitigation layer as a function of deposition time. As shown in graph 1506, in some embodiments the PID mitigation layer 116 may comprise a metal value (e.g., a titanium value) shown by line 1508 and a nitrogen value shown by line 1510. In some additional embodiments, the PID mitigation layer 116 may further comprise oxygen (shown by line 1512) and/or silicon (shown by line 1514). In some embodiments, box 1516 illustrates a range over which the PID mitigation layer 116 may be formed. In some embodiments, within the box 1516 the metal value shown by line 1508 may have a value of between approximately 45% and approximately 50%. In some embodiments, within the box 1516 the nitrogen value shown by line 1510 may be between approximately 45% and approximately 50%.

Figure 15C:
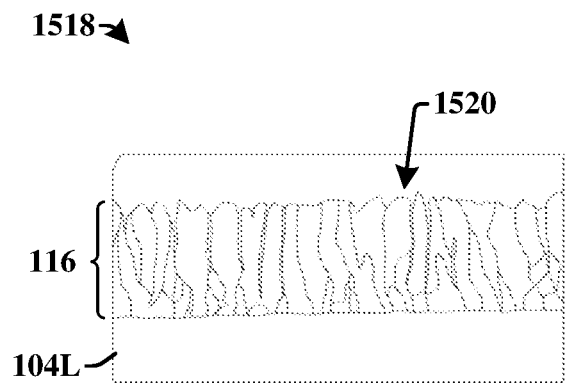

In some embodiments, the first pressure causes the PID mitigation layer 116 to be formed as a porous structure having a low density. In some embodiments, the first pressure may cause the PID mitigation layer 116 to form as fibrous and/or columnar structures. For example, FIG. 15C illustrates a cross-sectional view 1518 of some embodiments of a PID mitigation layer 116 formed at the first pressure. As shown in cross-sectional view 1518, the PID mitigation layer 116 comprises a plurality of columnar structures 1520 laterally adjacent to one another. The plurality of columnar structures 1520 are separate and distinct from one another so as to give the PID mitigation layer 116 a porous structure. In some embodiments, the plurality of columnar structures 1520 also have different heights, giving a top of the PID mitigation layer 116 a first roughness.

Figure 16:
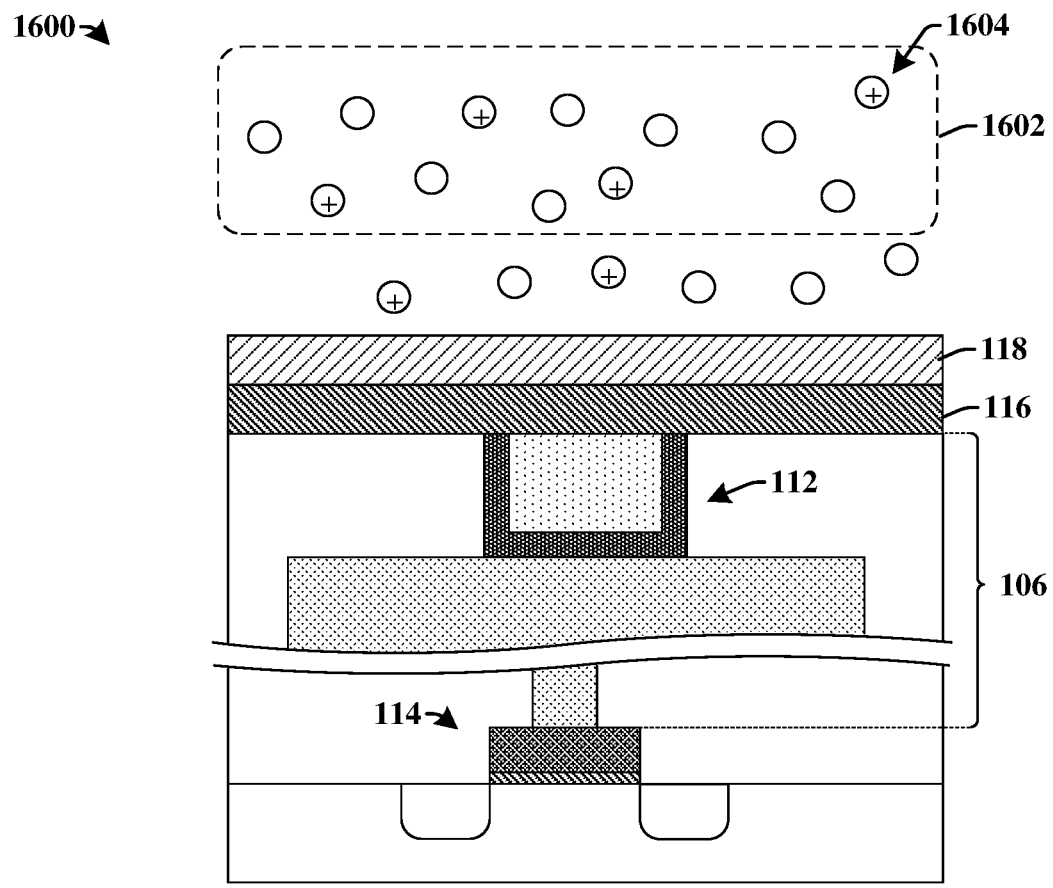

As shown in cross-sectional view 1600 of FIG. 16, a metal nitride layer 118 is formed over the PID mitigation layer 116. The metal nitride layer 118 may be formed using a second plasma deposition process. The second plasma deposition process utilizes a plasma 1602 having charged particles 1604 to form the metal nitride layer 118 on the PID mitigation layer 116. The PID mitigation layer 116 prevents charged particles 1604 from the plasma 1602 from transferring to the one or more lower interconnects 106. In some embodiments, the PID mitigation layer 116 may comprise a conductive layer (e.g., a conductive metal nitride layer) that has a lower resistance than the one or more lower interconnects 106. Because the PID mitigation layer 116 has a lower resistance than the one or more lower interconnects 106, the charged particles 1604 within the plasma 1602 will flow across the PID mitigation layer 116 rather than flowing through the one or more lower interconnects 106, thereby mitigating plasma induced damage.

In some embodiments, the second plasma deposition process may be performed at a second pressure that is less than the first pressure. For example, the metal nitride layer 118 may be formed at a sputtering gas pressure of less than or equal to approximately 7 mTorr, less than or equal to approximately 5 mTorr, or the like. Forming the metal nitride layer 118 at the second pressure causes the metal nitride layer 118 to have an upper surface with a second roughness that is less than the first roughness, thereby giving an upper surface of the metal nitride layer 118 a greater smoothness than an upper surface of the PID mitigation layer 116. In some embodiments, the second pressure also causes the metal nitride layer 118 to be formed to have a second nitrogen concentration that is higher than the first nitrogen concentration of the PID mitigation layer 116. In some embodiments, the metal nitride layer 118 may also be formed to have a higher density than the PID mitigation layer 116.

Figure 17:
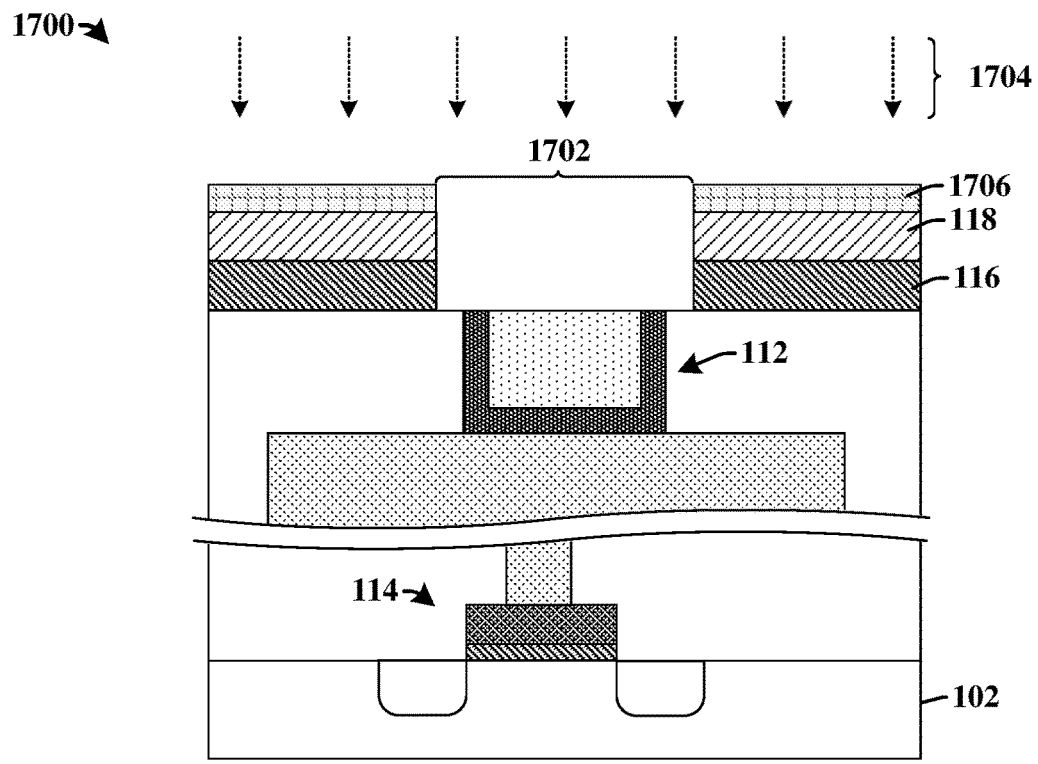

As shown in cross-sectional view 1700 of FIG. 17, the metal nitride layer 118 and the PID mitigation layer 116 are patterned according to a second patterning process to form a first upper interconnect opening 1702. The first upper interconnect opening 1702 extends through the metal nitride layer 118 and the PID mitigation layer 116 to expose an upper surface of the third lower interconnect 112. In some embodiments, the metal nitride layer 118 and the PID mitigation layer 116 may be patterned by selectively exposing the metal nitride layer 118 and the PID mitigation layer 116 to a second etchant 1704 according to a second mask 1706. In some embodiments, the second patterning process may be performed at a relatively low power (e.g., less than or equal to 100 W), so as to avoid plasma induced damage.

Figure 18:
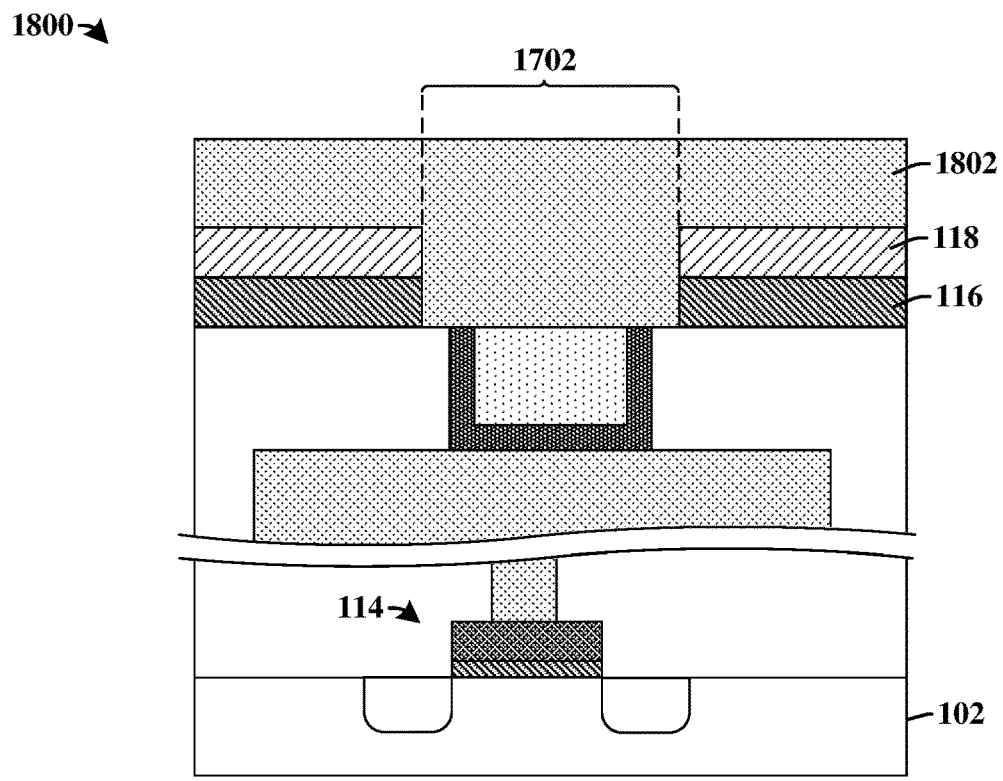

As shown in cross-sectional view 1800 of FIG. 18, a second conductive material 1802 is formed onto the metal nitride layer 118 and within the first upper interconnect opening 1702. In various embodiments, the second conductive material 1802 may comprise aluminum, ruthenium, tungsten, copper, or the like. The second conductive material 1802 may be formed by a deposition process (e.g., a PVD process, a CVD process, a PE-CVD process, or the like), and/or by a plating process (e.g., electroplating, electro-less plating, etc.). In some embodiments, the second conductive material 1802 may be formed at a relatively low power (e.g., less than or equal to 100 W), so as to avoid plasma induced damage.

Figure 19:
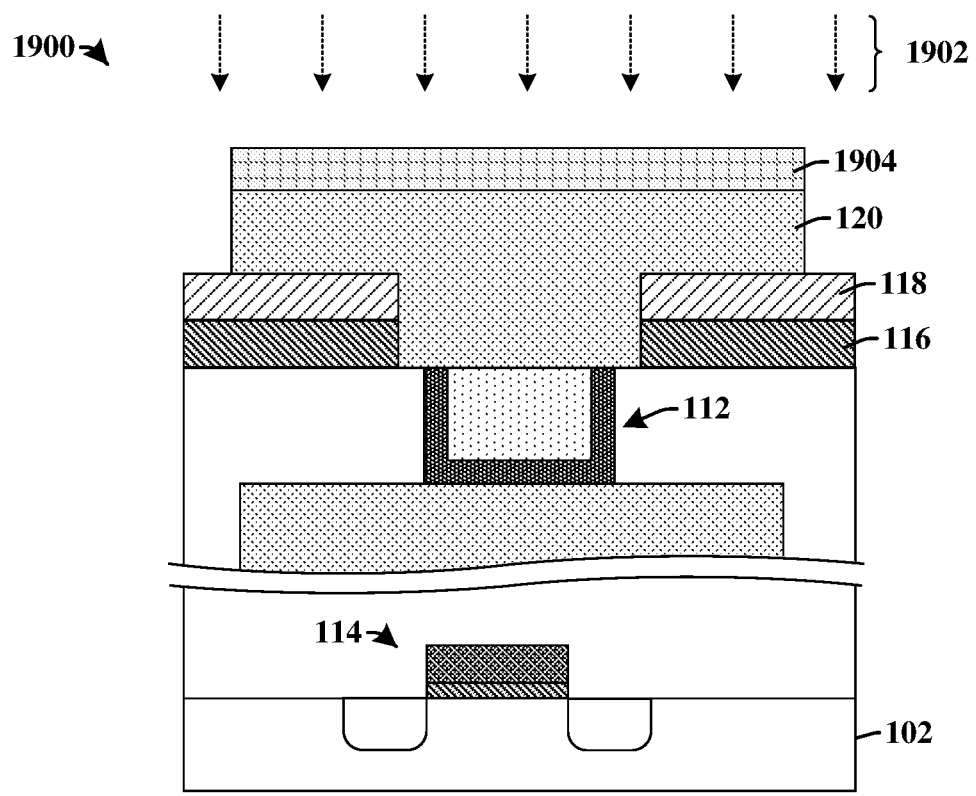

As shown in cross-sectional view 1900 of FIG. 19, the second conductive material (e.g., 1802 of FIG. 18) is patterned according to a third patterning process to form a first upper interconnect 120. The first upper interconnect 120 contacts the third lower interconnect 112. In some embodiments, the second conductive material may be patterned according to a third patterning process that selectively exposes the second conductive material to a third etchant 1902 according to a third mask 1904. In some embodiments, the third patterning process may be performed at a relatively low power (e.g., less than or equal to 100 W), so as to avoid plasma induced damage.

Figure 20:
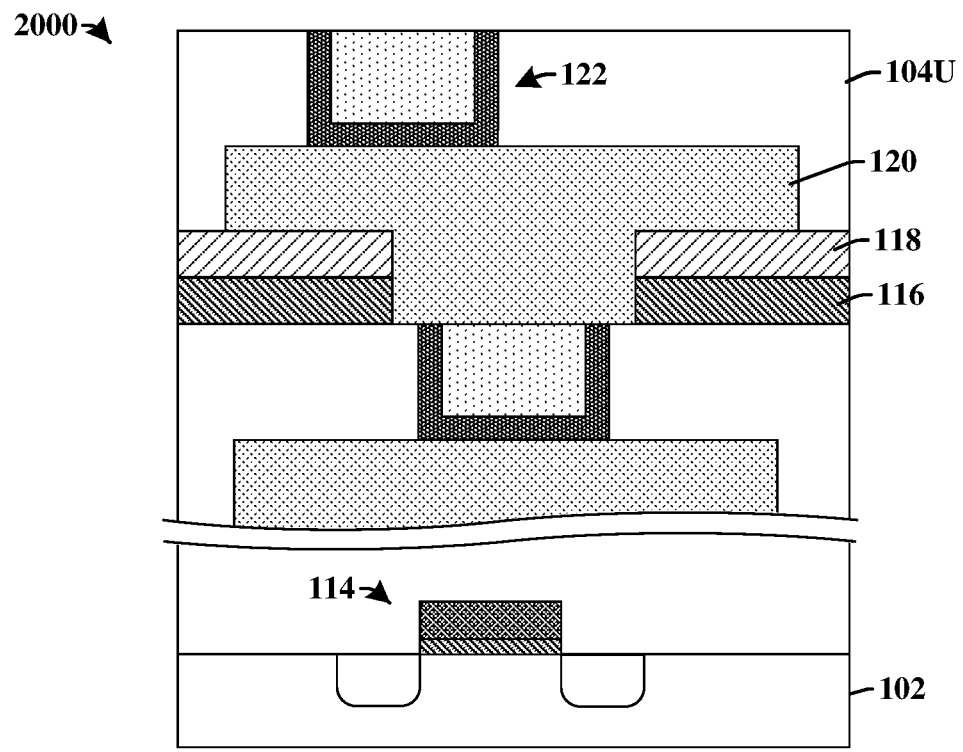

As shown in cross-sectional view 2000 of FIG. 20, an upper ILD structure 104U is formed over and laterally surrounding the first upper interconnect 120. The upper ILD structure 104U may comprise one or more upper ILD layers. In some embodiments, the upper ILD structure 104U may be formed by one or more deposition processes (e.g., a PVD process, a CVD process, a PE-CVD process, or the like). The upper ILD structure 104U may comprise one or more of silicon dioxide, SiCOH, BSG, PSG, BPSG, FSG, USG, or the like.

A second upper interconnect 122 is formed within the upper ILD structure 104U. The second upper interconnect 122 extends through the upper ILD structure 104U to contact the first upper interconnect 120. In some embodiments, the second upper interconnect 122 may be formed using a damascene process (e.g., a single damascene process or a dual damascene process). The damascene process is performed by etching the upper ILD structure 104U to form a second upper interconnect opening (e.g., via hole and/or the trench), and filling the second upper interconnect opening with a third conductive material. In some embodiments, the third conductive material (e.g., tungsten, copper, aluminum, or the like) may be formed using a deposition process and/or a plating process (e.g., electroplating, electro-less plating, etc.).

FIGS. 21-28 illustrate some additional embodiments of a method of forming an integrated chip structure comprising a PID mitigation layer.

Figure 21:
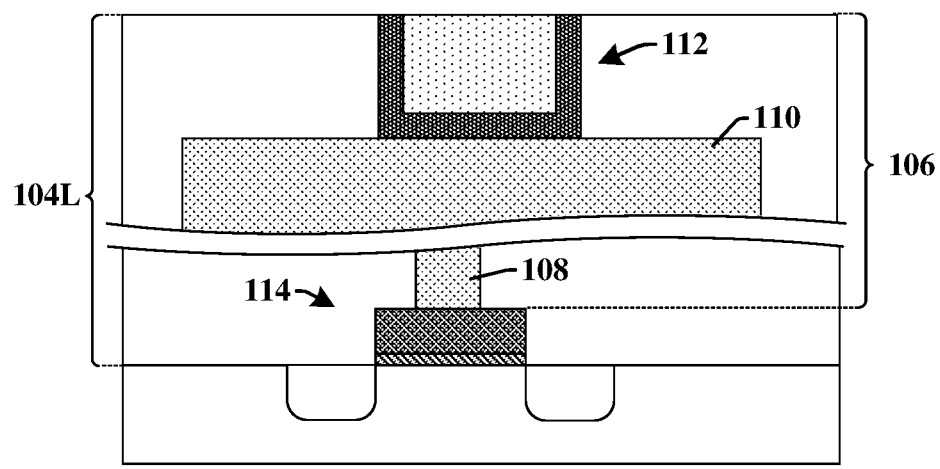
FIGS. 21-28 illustrate some additional embodiments of a method of forming an integrated chip structure comprising a PID mitigation layer.

As shown in cross-sectional view 2100 of FIG. 21, a semiconductor device 114 is formed on and/or within the substrate 102. One or more lower interconnects 106 are formed within a lower ILD structure 104L formed over the substrate 102. In some embodiments, the one or more lower interconnects 106 may comprise a first lower interconnect 108, a second lower interconnect 110, and a third lower interconnect 112. In some embodiments, the semiconductor device 114 and the one or more lower interconnects 106 may be formed as described in the description associated with FIGS. 10-14.

Figure 22:
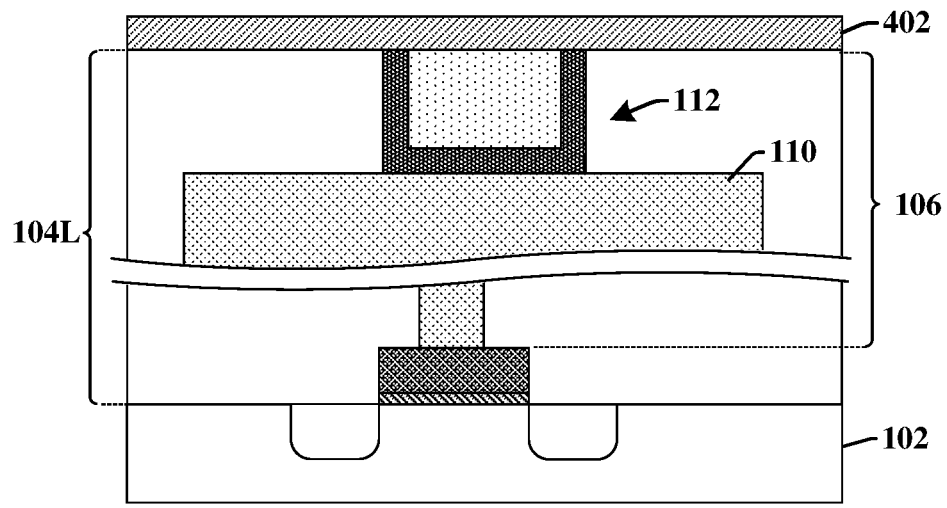

As shown in cross-sectional view 2200 of FIG. 22, a dielectric layer 402 is formed onto the lower ILD structure 104L. The dielectric layer 402 is formed using a deposition process that is performed at a relatively low power (e.g., less than approximately 100 W, less than approximately 200 W, or other similar values). The low power prevents plasma induced damage from occurring during formation of the dielectric layer 402.

Figure 23:
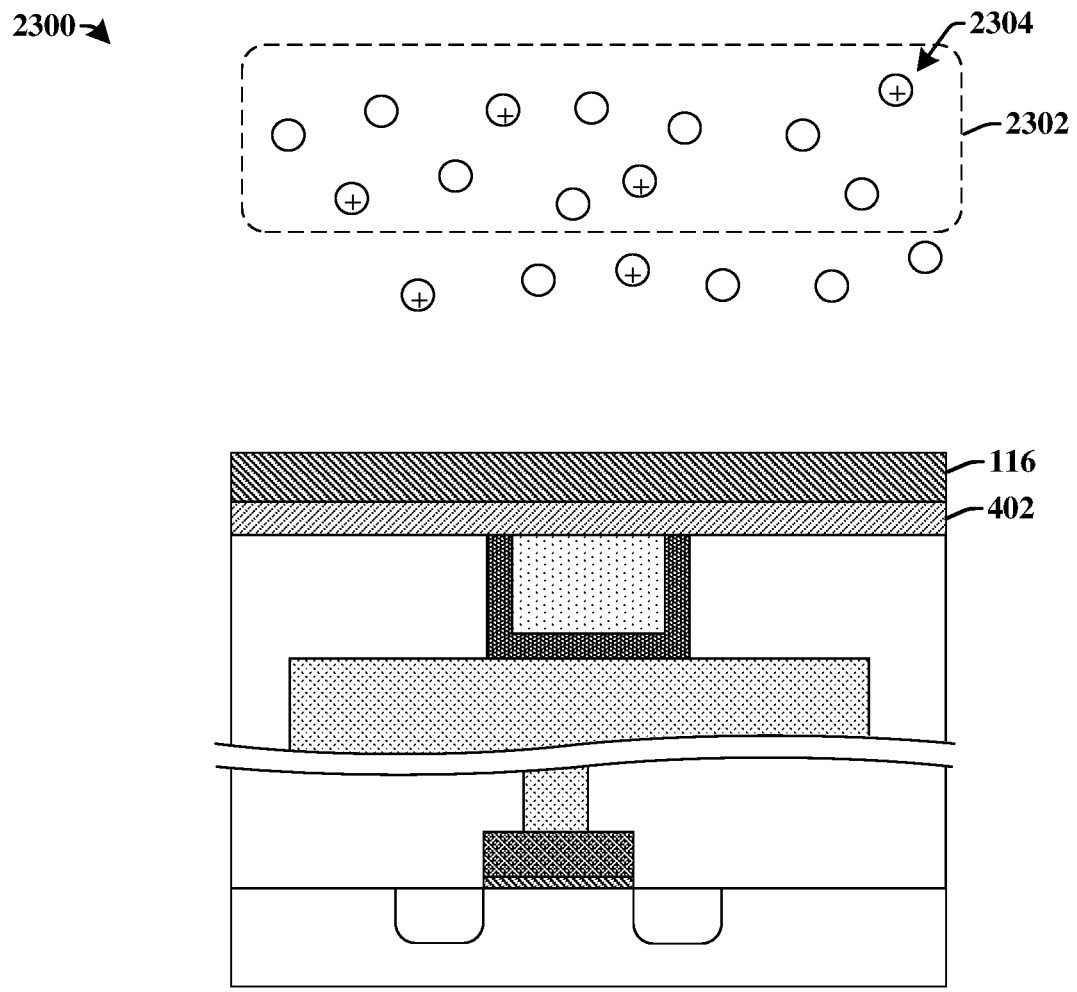

As shown in cross-sectional view 2300 of FIG. 23, a PID mitigation layer 116 is formed onto the dielectric layer 402. In some embodiments, the PID mitigation layer 116 is formed using a first plasma deposition process performed at a first pressure (e.g., greater than approximately 20 mTorr, greater than approximately 15 mTorr, or the like). In such embodiments, the first pressure increases a number of collisions between charged particles 2304 of a plasma 2302. The collisions reduce an energy of the charged particles 2304, thereby reducing plasma induced damage. In some embodiments, the first pressure may cause the PID mitigation layer 116 to form as a porous structure having fibrous and/or columnar structures.

Figure 24:
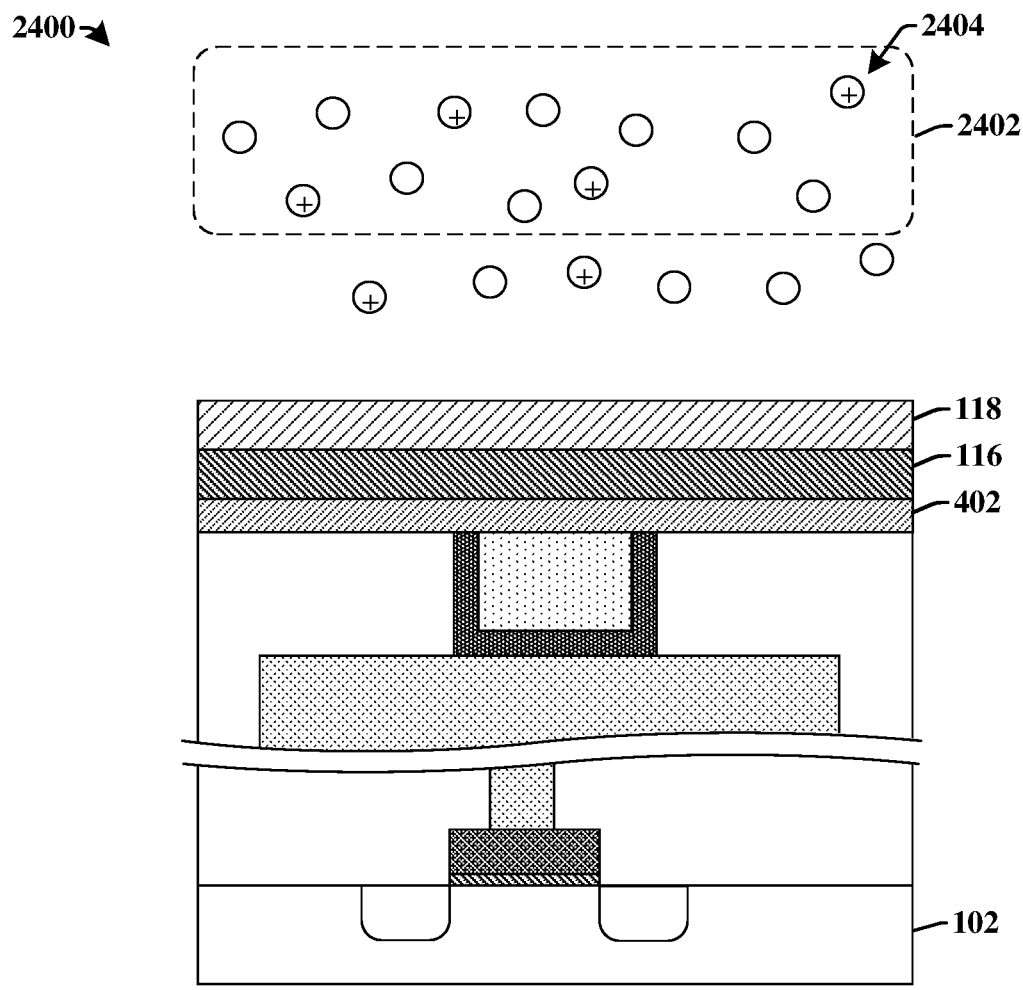

As shown in cross-sectional view 2400 of FIG. 24, a metal nitride layer 118 is formed over the PID mitigation layer 116. In some embodiments, the metal nitride layer 118 may be formed using a second plasma deposition process performed at a second pressure that is less than the first pressure. The second plasma deposition process utilizes a plasma 2402 having charged particles 2404 to form the metal nitride layer 118 on the PID mitigation layer 116. The PID mitigation layer 116 prevents charged particles 2404 from the plasma 2402 from transferring to the one or more lower interconnects 106.

Figure 25:
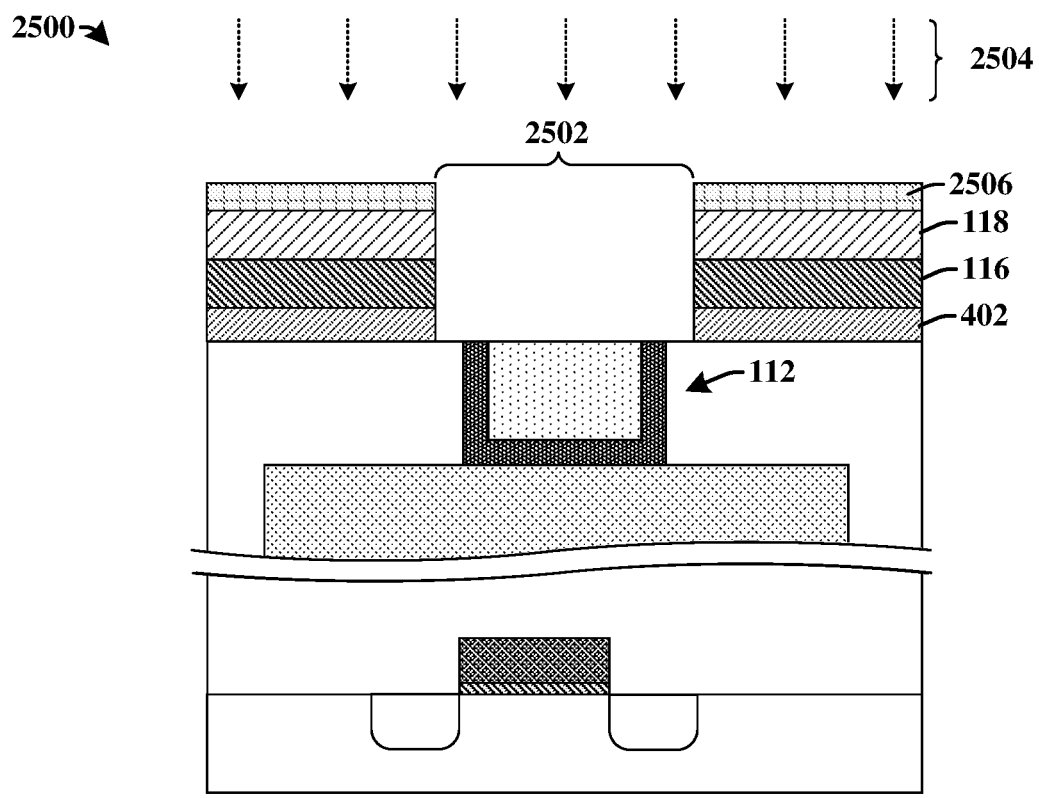

As shown in cross-sectional view 2500 of FIG. 25, the metal nitride layer 118, the PID mitigation layer 116, and the dielectric layer 402 are patterned to form a first upper interconnect opening 2502. The first upper interconnect opening 2502 extends through the metal nitride layer 118, the PID mitigation layer 116, and the dielectric layer 402 to expose an upper surface of the third lower interconnect 112. In some embodiments, the metal nitride layer 118, the PID mitigation layer 116, and the dielectric layer 402 may be patterned by a first patterning process that selectively exposes the metal nitride layer 118, the PID mitigation layer 116, and the dielectric layer 402 to a first etchant 2504 according to a first mask 2506.

Figure 26:
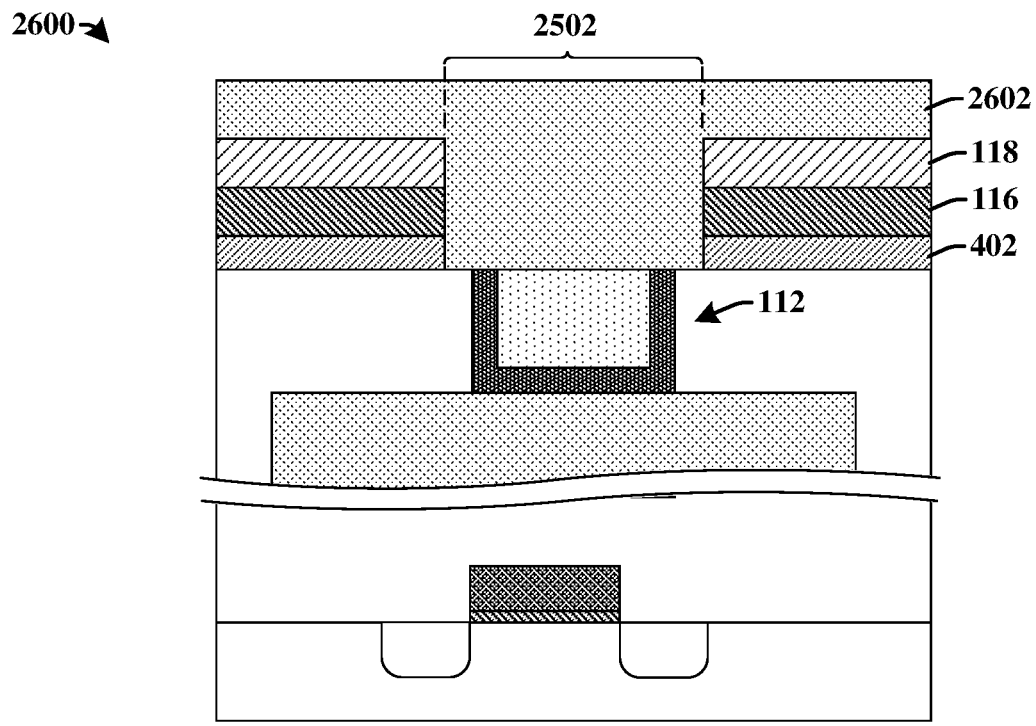

As shown in cross-sectional view 2600 of FIG. 26, a second conductive material 2602 is formed onto the metal nitride layer 118 and within the first upper interconnect opening 2502. In some embodiments, the second conductive material 2602 may be formed as described in the description associated with FIG. 18.

Figure 27:
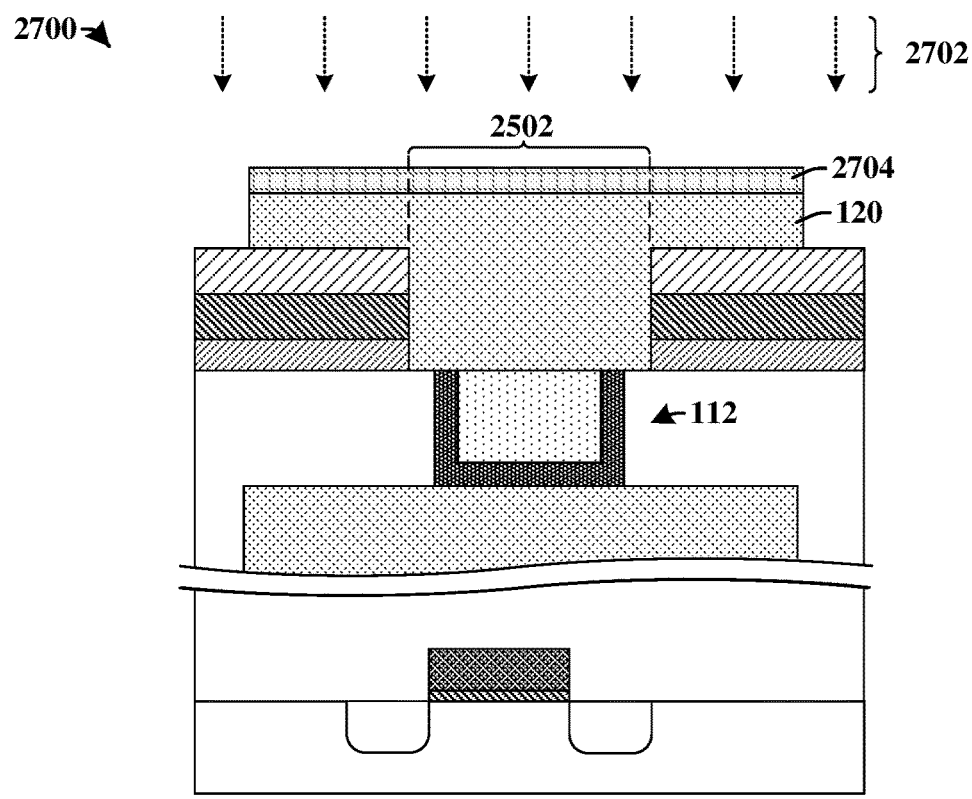

As shown in cross-sectional view 2700 of FIG. 27, the second conductive material (e.g., 2602 of FIG. 26) is patterned to form a first upper interconnect 120. The first upper interconnect 120 extends through the first upper interconnect opening 2502 to contact the third lower interconnect 112. In some embodiments, the second conductive material may be patterned by a second patterning process that selectively exposes the second conductive material to a second etchant 2702 according to a second mask 2704.

Figure 28:
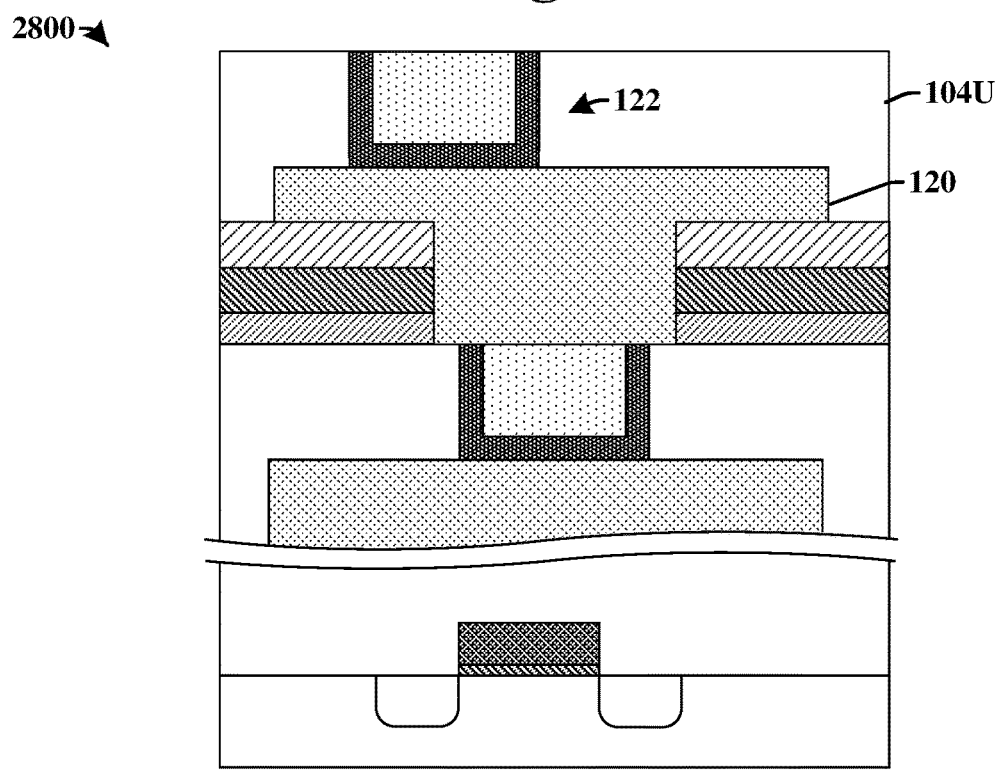

As shown in cross-sectional view 2800 of FIG. 28, an upper ILD structure 104U is formed over and laterally surrounding the first upper interconnect 120. The upper ILD structure 104U may be formed by a deposition process (e.g., a PVD process, a CVD process, a PE-CVD process, or the like). A second upper interconnect 122 is formed within the upper ILD structure 104U. The second upper interconnect 122 extends through the upper ILD layer to contact the first upper interconnect 120.

FIGS. 29-34 illustrate some additional embodiments of a method of forming an integrated chip structure comprising a PID mitigation layer.

Figure 29:
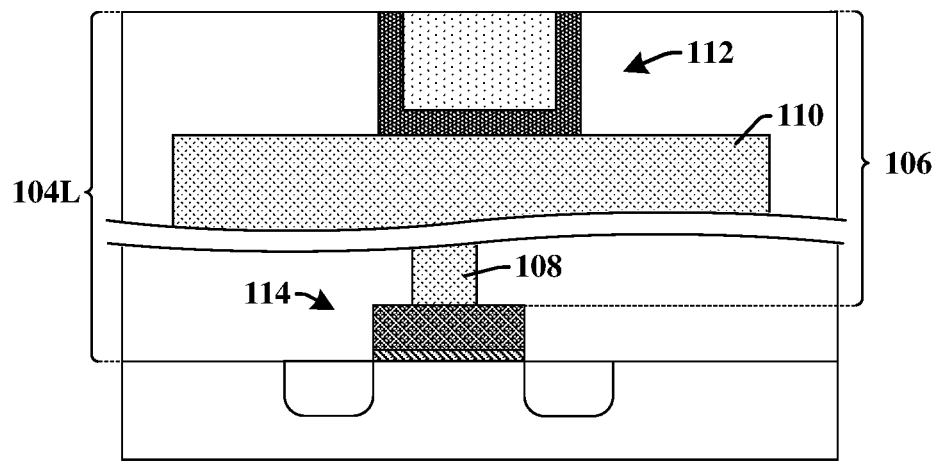
FIGS. 29-34 illustrate some additional embodiments of a method of forming an integrated chip structure comprising a PID mitigation layer.

As shown in cross-sectional view 2900 of FIG. 29, a semiconductor device 114 is formed on and/or within the substrate 102. One or more lower interconnects 106 are formed within a lower ILD structure 104L formed over the substrate 102. In some embodiments, the one or more lower interconnects 106 may comprise a first lower interconnect 108, a second lower interconnect 110, and a third lower interconnect 112. In some embodiments, the semiconductor device 114 and the one or more lower interconnects 106 may be formed as described in the description associated with FIGS. 10-14.

Figure 30:
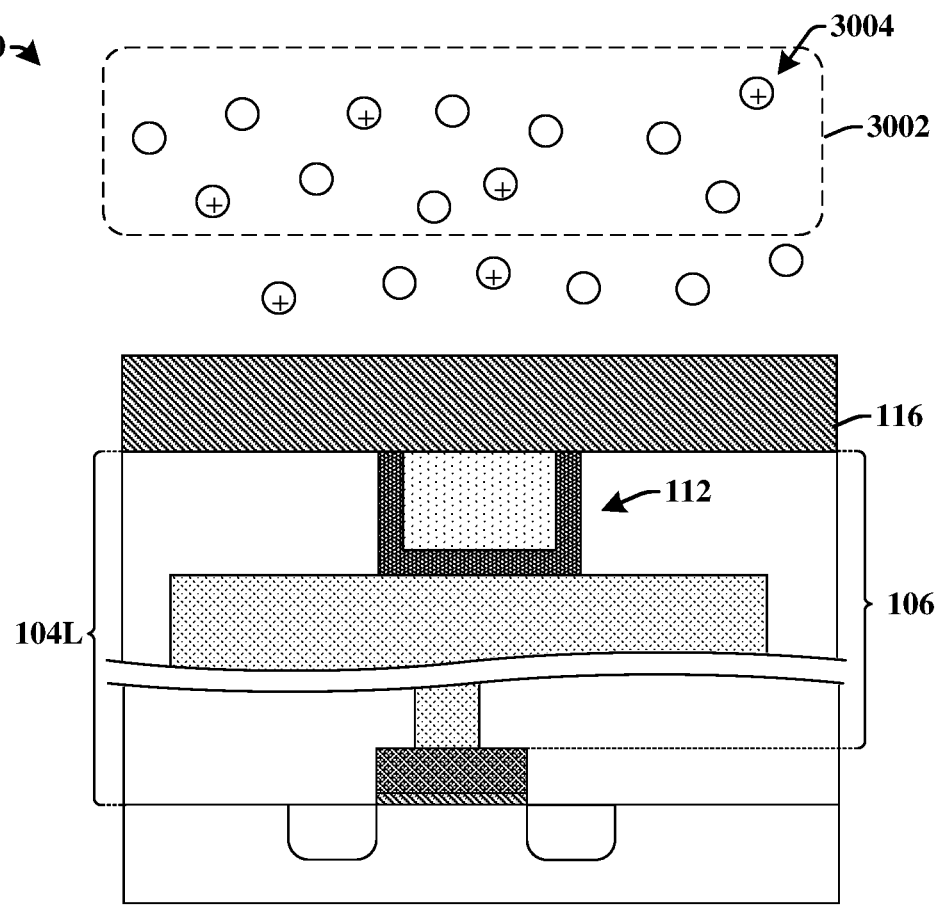

As shown in cross-sectional view 3000 of FIG. 30, a PID mitigation layer 116 is formed onto the lower ILD structure 104L. In some embodiments, the PID mitigation layer 116 is formed using a first plasma deposition process performed at a first pressure (e.g., greater than approximately 20 mTorr, greater than approximately 15 mTorr, or the like). In such embodiments, the first pressure increases a number of collisions between charged particles 3004 of a plasma 3002. The collisions reduce an energy of the charged particles 3004, thereby reducing plasma induced damage. In some embodiments, the first pressure may cause the PID mitigation layer 116 to form as a porous structure having fibrous and/or columnar structures.

Figure 31:
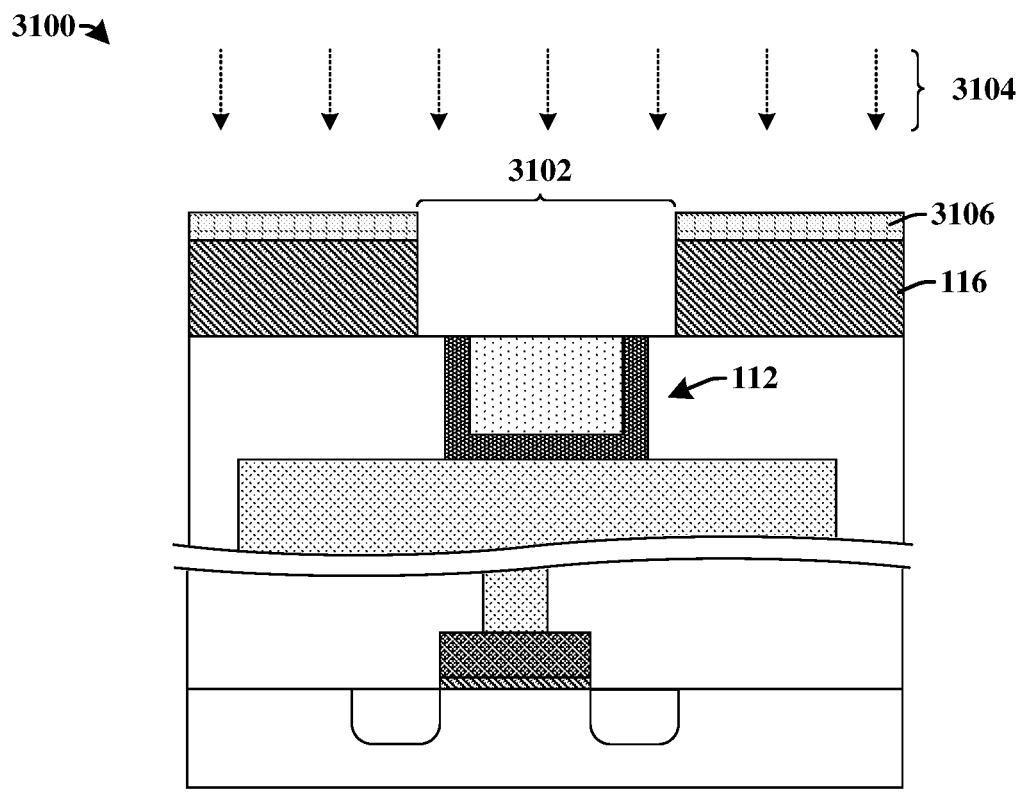

As shown in cross-sectional view 3100 of FIG. 31, the PID mitigation layer 116 is patterned to form a first upper interconnect opening 3102. The first upper interconnect opening 3102 extends through the PID mitigation layer 116 to expose an upper surface of the third lower interconnect 112. In some embodiments, the PID mitigation layer 116 may be patterned by a first patterning process that selectively exposes the PID mitigation layer 116 to a first etchant 3104 according to a first mask 3106. In some embodiments, the first patterning process may be performed at a relatively low power (e.g., less than or equal to 100 W), so as to avoid plasma induced damage on the semiconductor device 114.

Figure 32:
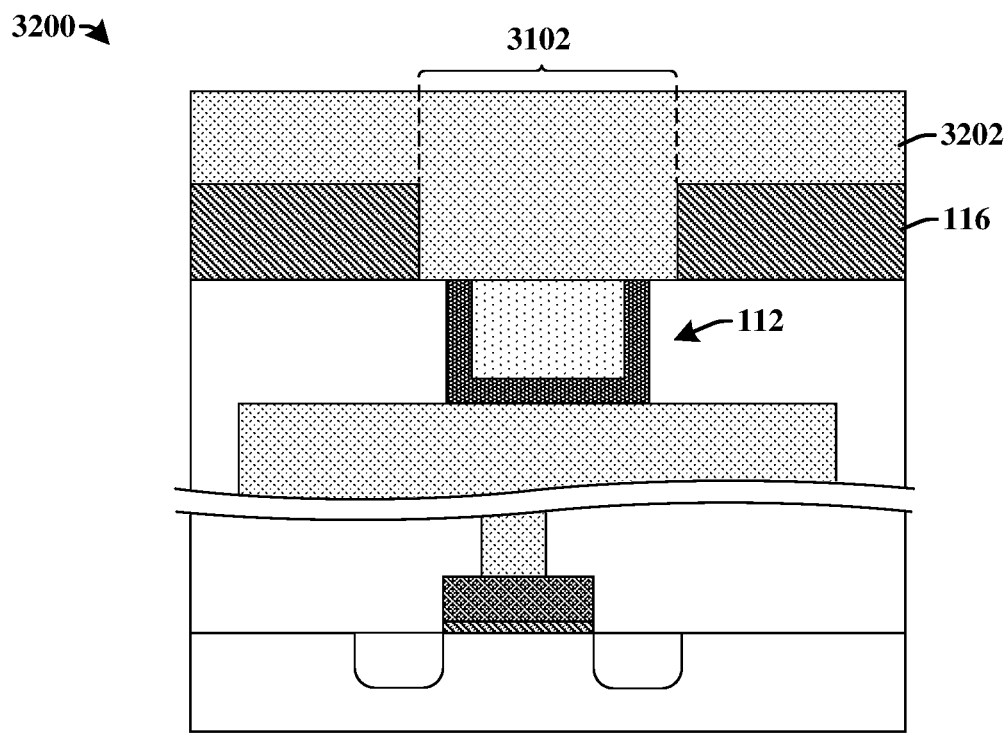

As shown in cross-sectional view 3200 of FIG. 32, a second conductive material 3202 is formed onto the PID mitigation layer 116 and within the first upper interconnect opening 3102. In some embodiments, the second conductive material 3202 may be formed as described in the description associated with FIG. 18.

Figure 33:
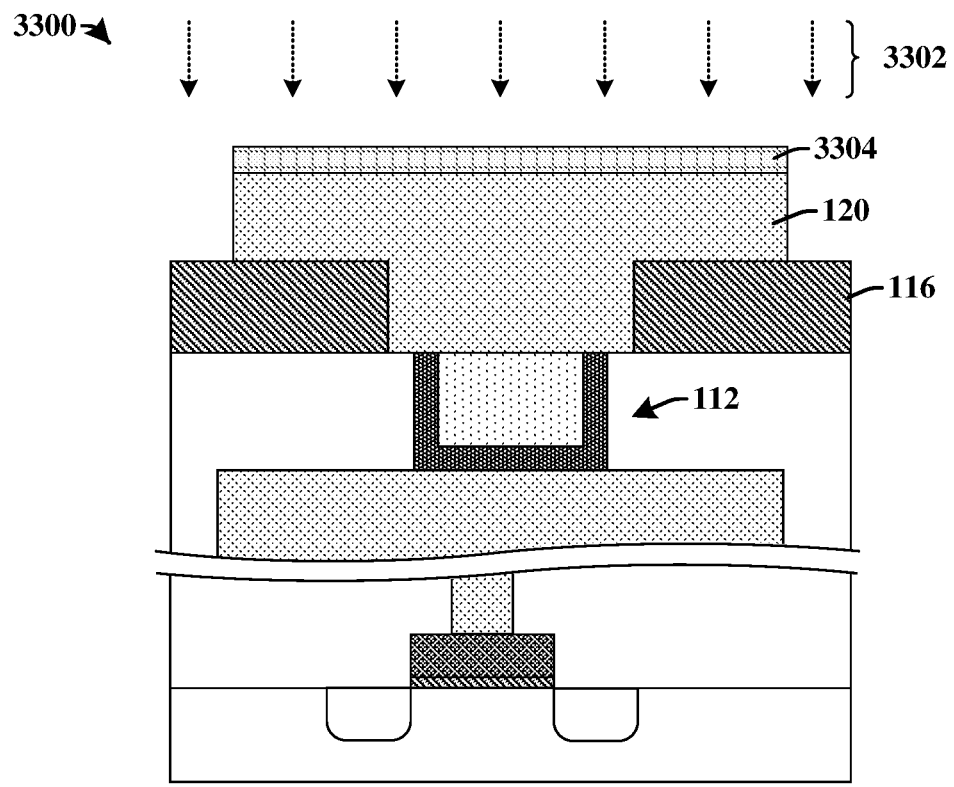

As shown in cross-sectional view 3300 of FIG. 33, the second conductive material (e.g., 3202) is patterned to form a first upper interconnect 120. The first upper interconnect 120 extends through the first upper interconnect opening 3102 to contact the third lower interconnect 112. In some embodiments, the second conductive material may be patterned by a second patterning process that selectively exposes the second conductive material to a second etchant 3302 according to a second mask 3304.

Figure 34:
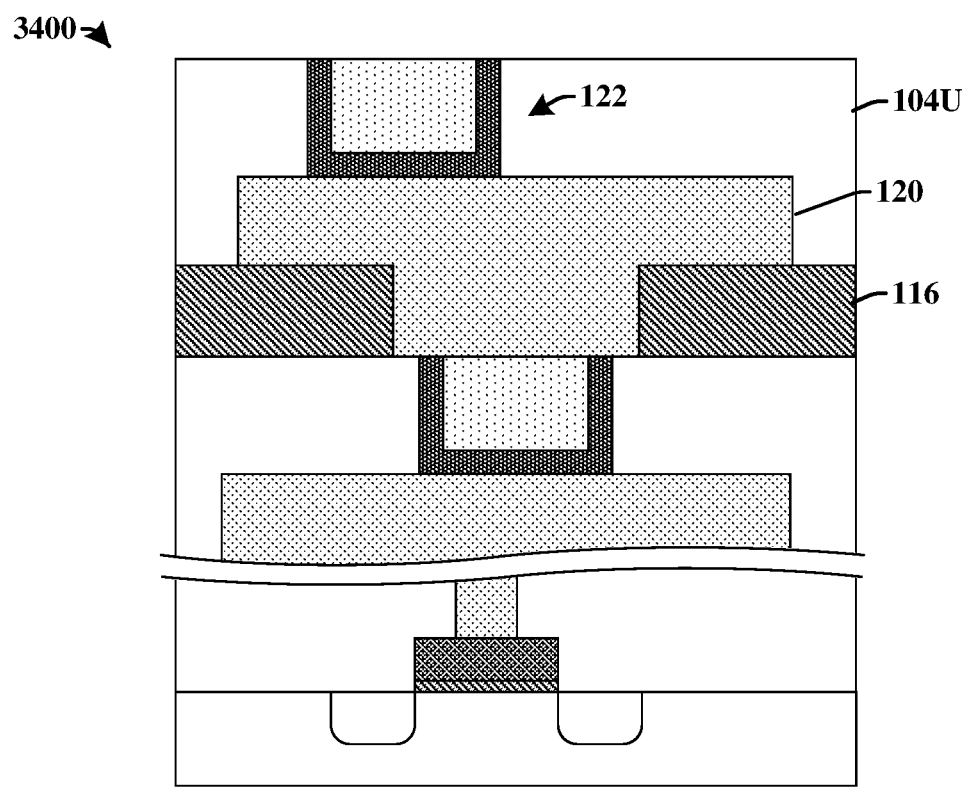

As shown in cross-sectional view 3400 of FIG. 34, an upper ILD structure 104U is formed over and laterally surrounding the first upper interconnect 120. A second upper interconnect 122 is formed within the upper ILD structure 104U. The second upper interconnect 122 extends through the upper ILD layer to contact the first upper interconnect 120.

FIGS. 35-42 illustrate some embodiments of a method of forming an integrated chip structure comprising a PID mitigation layer having a plurality of sub-layers.

Figure 35:
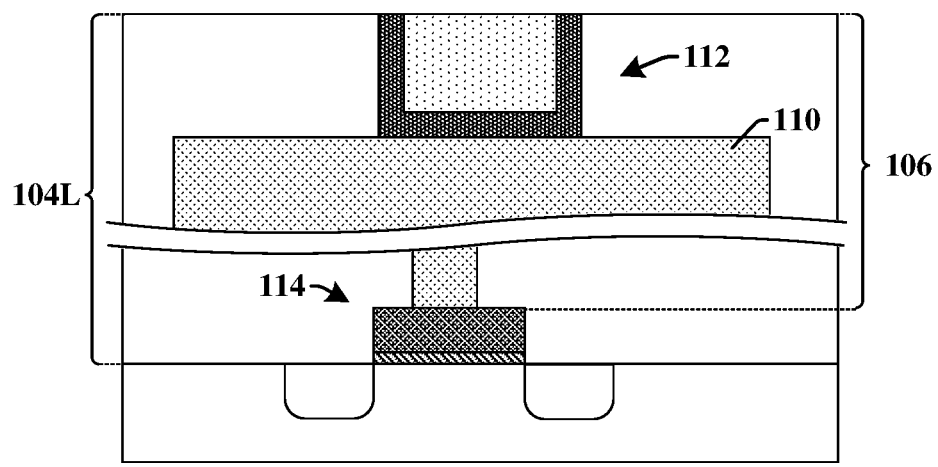
FIGS. 35-42 illustrate some additional embodiments of a method of forming an integrated chip structure comprising a PID mitigation layer having a plurality of sub-layers.

As shown in cross-sectional view 3500 of FIG. 35, a semiconductor device 114 is formed on and/or within the substrate 102. One or more lower interconnects 106 are formed within a lower ILD structure 104L formed over the substrate 102. In some embodiments, the one or more lower interconnects 106 may comprise a first lower interconnect 108, a second lower interconnect 110, and a third lower interconnect 112. In some embodiments, the semiconductor device 114 and the one or more lower interconnects 106 may be formed as described in the description associated with FIGS. 10-14.

Figure 36:
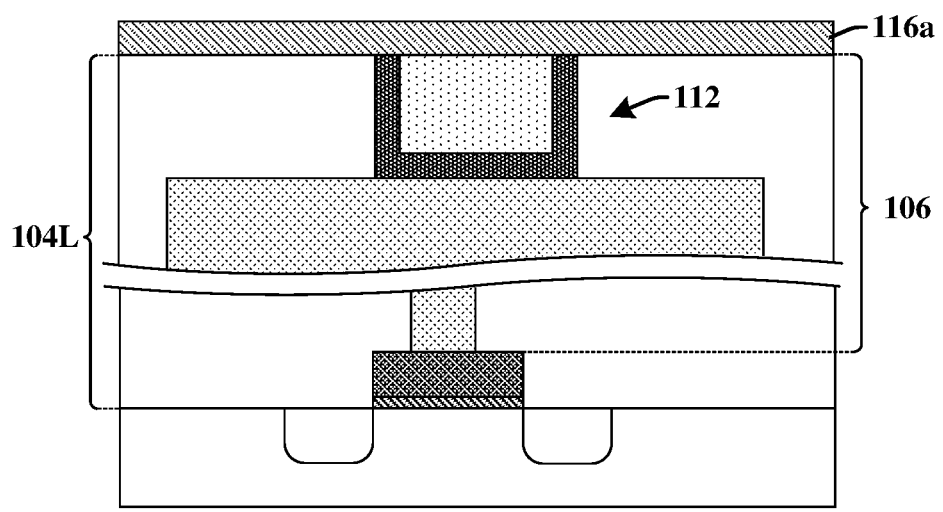

As shown in cross-sectional views 3600 of FIG. 36, a first PID mitigation sub-layer 116a is formed onto the lower ILD structure 104L. In some embodiments, the first PID mitigation sub-layer 116a may be formed to have a first nitrogen content. In some embodiments, the first PID mitigation sub-layer 116a may be formed by a first plasma deposition process performed at a first pressure.

Figure 37:
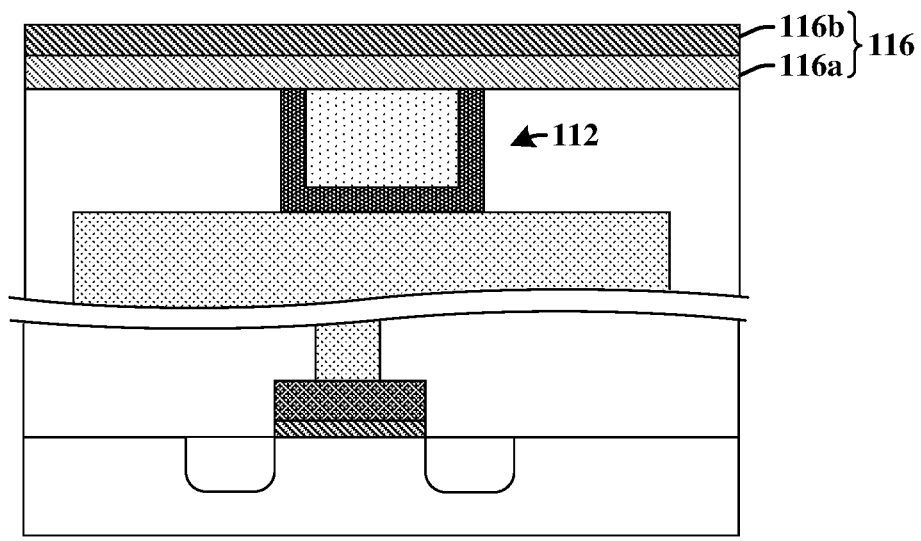

As shown in cross-sectional views 3700 of FIG. 37, a second PID mitigation sub-layer 116b is formed onto the first PID mitigation sub-layer 116a to form a PID mitigation layer 116. In some embodiments, the second PID mitigation sub-layer 116b may be formed to have a second nitrogen content that is larger than the first nitrogen content. In some embodiments, the second PID mitigation sub-layer 116b may be formed by a second plasma deposition process performed at a second pressure that is smaller than the first pressure. In some embodiments, both the first pressure and the second pressure may be greater than approximately 20 mTorr, greater than approximately 15 mTorr, or the like.

Figure 38:
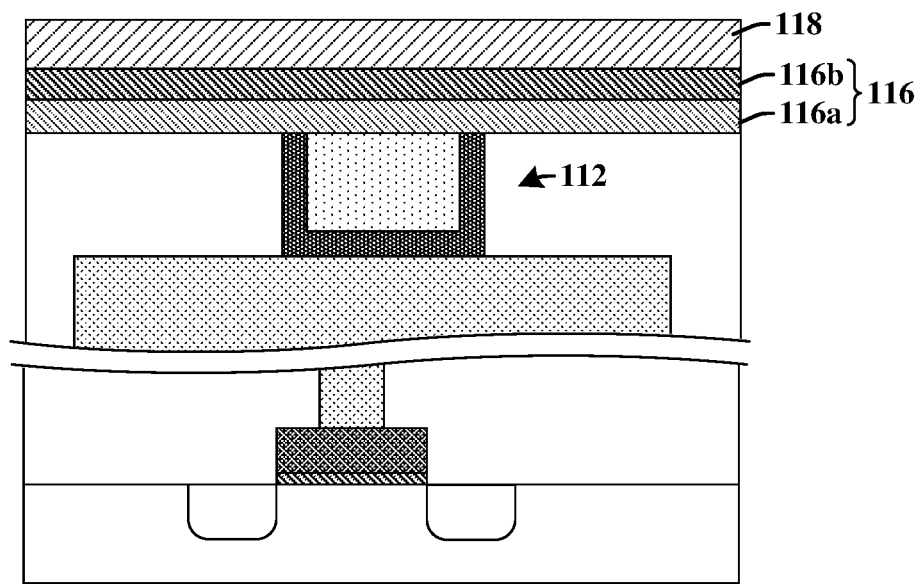

As shown in cross-sectional view 3800 of FIG. 38, a metal nitride layer 118 is formed over the PID mitigation layer 116. In some embodiments, the metal nitride layer 118 may be formed by a third plasma deposition process performed at a third pressure that is greater than the second pressure. The PID mitigation layer 116 prevents charged particles from a plasma used in the third plasma deposition process from transferring to the one or more lower interconnects 106.

Figure 39:
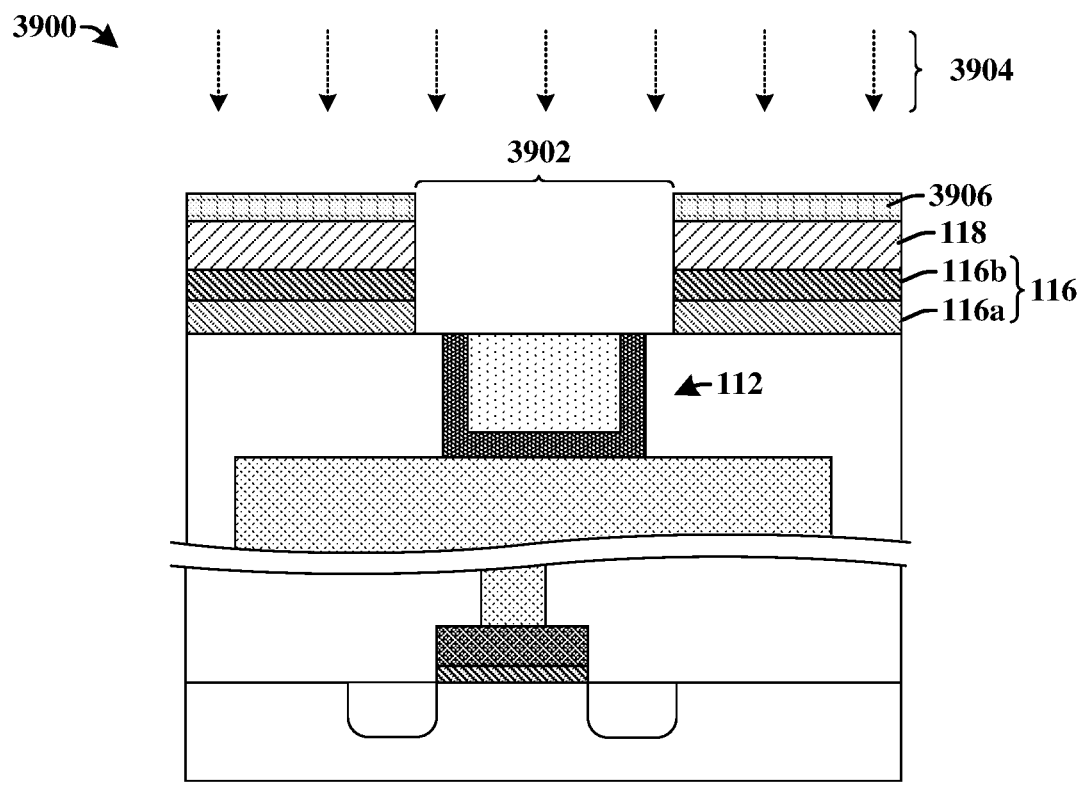

As shown in cross-sectional view 3900 of FIG. 39, the PID mitigation layer 116 and the metal nitride layer 118 are patterned to form a first upper interconnect opening 3902. The first upper interconnect opening 3902 extends through the PID mitigation layer 116 and the metal nitride layer 118 to expose an upper surface of the third lower interconnect 112. In some embodiments, the PID mitigation layer 116 and the metal nitride layer 118 may be patterned by a first patterning process that selectively exposes the PID mitigation layer 116 and the metal nitride layer 118 to a first etchant 3904 according to a first mask 3906.

Figure 40:
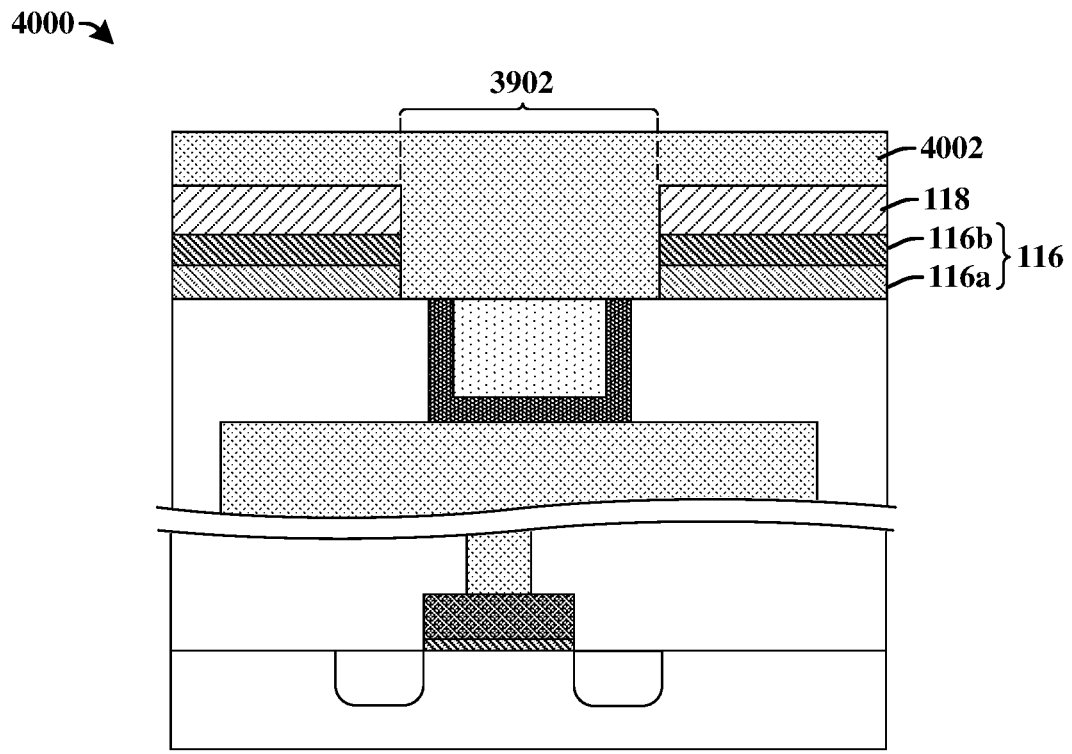

As shown in cross-sectional view 4000 of FIG. 40, a second conductive material 4002 is formed onto the metal nitride layer 118 and within the first upper interconnect opening 3902. In some embodiments, the second conductive material 4002 may be formed as described in the description associated with FIG. 18.

Figure 41:
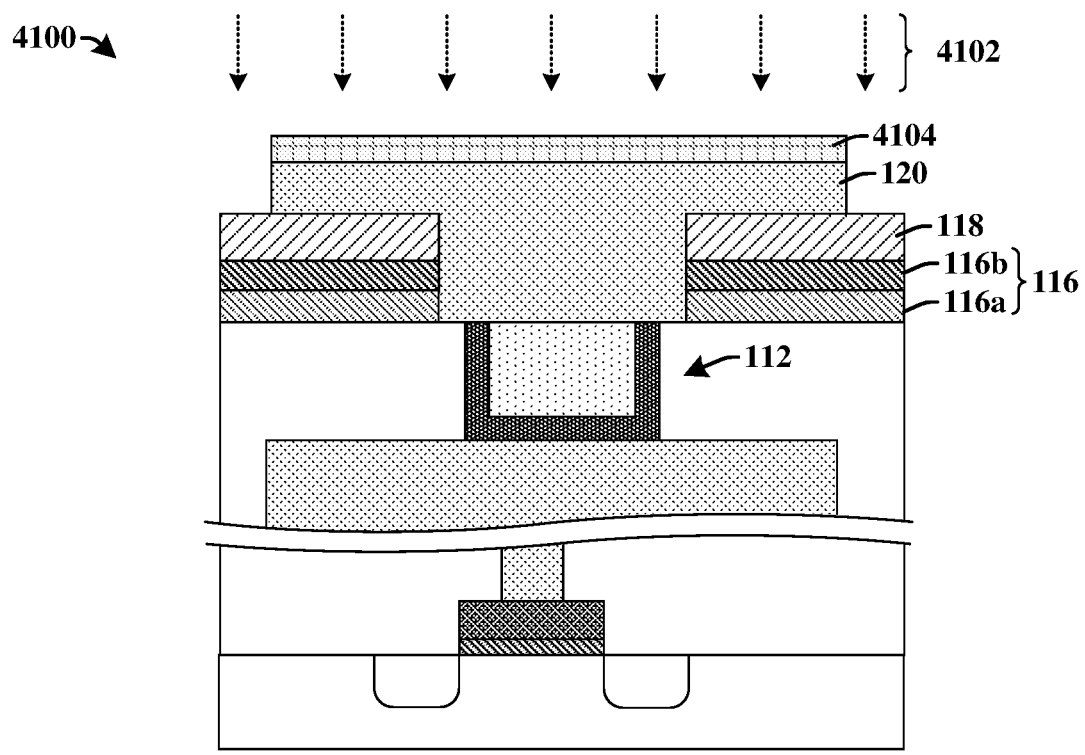

As shown in cross-sectional view 4100 of FIG. 41, the second conductive material (e.g., 4002 of FIG. 40) is patterned to form a first upper interconnect 120. The first upper interconnect 120 extends through the first upper interconnect opening 3902 to contact the third lower interconnect 112. In some embodiments, the second conductive material may be patterned by a second patterning process that selectively exposes the second conductive material to a second etchant 4102 according to a second mask 4104.

Figure 42:
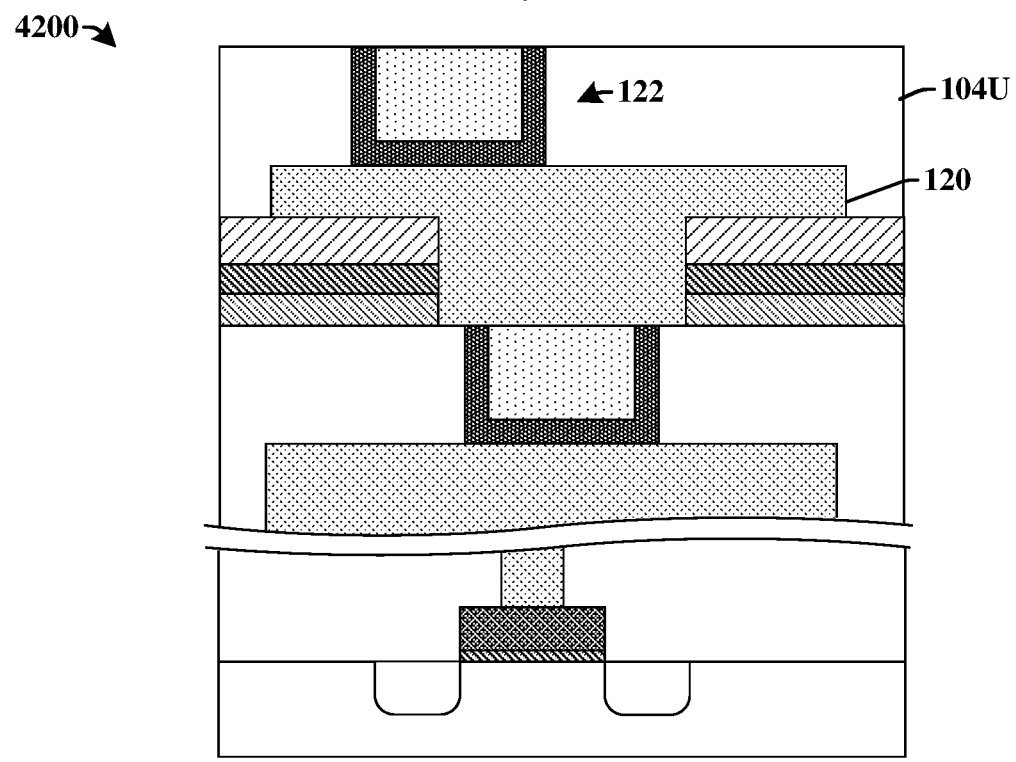

As shown in cross-sectional view 4200 of FIG. 42, an upper ILD structure 104U is formed over and laterally surrounding the first upper interconnect 120. A second upper interconnect 122 is formed within the upper ILD structure 104U. The second upper interconnect 122 extends through the upper ILD layer to contact the first upper interconnect 120.

FIGS. 43-49 illustrate some additional embodiments of a method of forming an integrated chip structure comprising a MIM structure having a PID mitigation layer.

Figure 43:
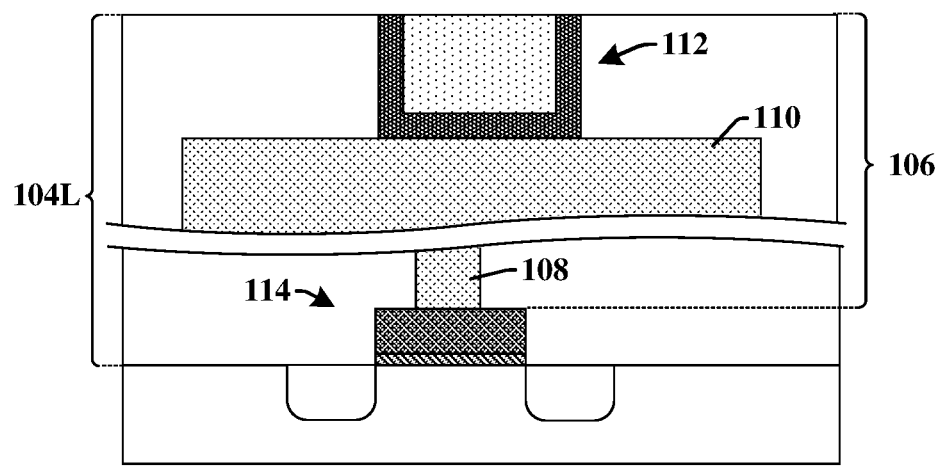
FIGS. 43-49 illustrate some additional embodiments of a method of forming an integrated chip structure comprising a MIM structure having a PID mitigation layer.

As shown in cross-sectional view 4300 of FIG. 43, a semiconductor device 114 is formed on and/or within the substrate 102. One or more lower interconnects 106 are formed within a lower ILD structure 104L formed over the substrate 102. In some embodiments, the one or more lower interconnects 106 may comprise a first lower interconnect 108, a second lower interconnect 110, and a third lower interconnect 112. In some embodiments, the semiconductor device 114 and the one or more lower interconnects 106 may be formed as described in the description associated with FIGS. 10-14.

Figure 44:
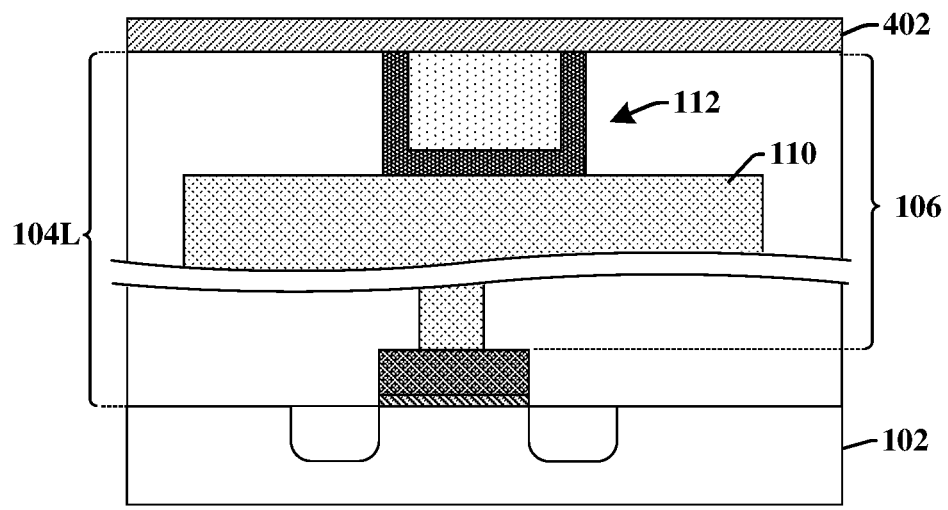

As shown in cross-sectional view 4400 of FIG. 44, a dielectric layer 402 is formed onto the lower ILD structure 104L. The dielectric layer 402 is formed using a deposition process that is performed at a relatively low power (e.g., less than approximately 100 W, less than approximately 200 W, or other similar values). The low power prevents plasma induced damage from occurring during formation of the dielectric layer 402.

Figure 45:
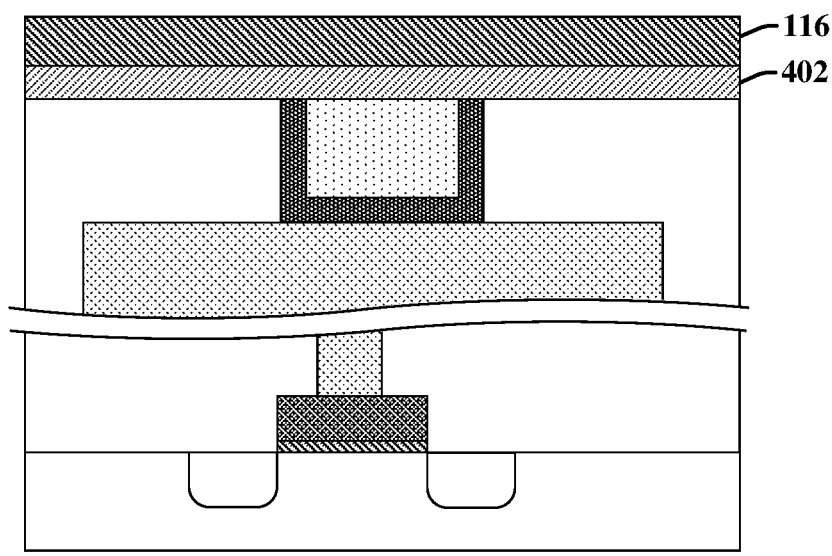

As shown in cross-sectional view 4500 of FIG. 45, a PID mitigation layer 116 is formed onto the dielectric layer 402. In some embodiments, the PID mitigation layer 116 is formed at using a first plasma deposition process performed at a first pressure (e.g., greater than approximately 20 mTorr, greater than approximately 15 mTorr, or the like). In some embodiments, the first pressure may cause the PID mitigation layer 116 to form as a porous structure having fibrous and/or columnar structures.

Figure 46:
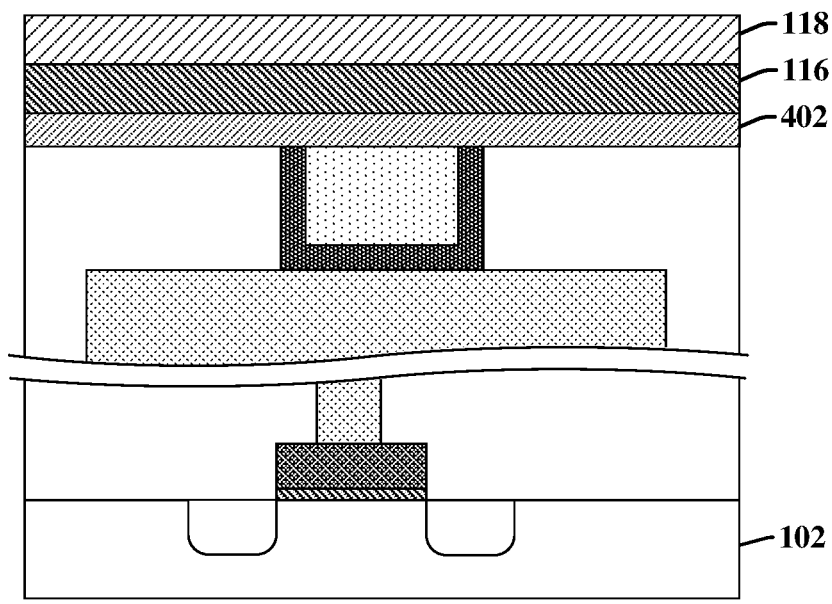

As shown in cross-sectional view 4600 of FIG. 46, a metal nitride layer 118 is formed over the PID mitigation layer 116. In some embodiments, the metal nitride layer 118 may be formed using a second plasma deposition process performed at a second pressure that is less than the first pressure. The PID mitigation layer 116 prevents charged particles 2404 from a plasma used during the second plasma deposition process from transferring to the one or more lower interconnects 106.

Figure 47:
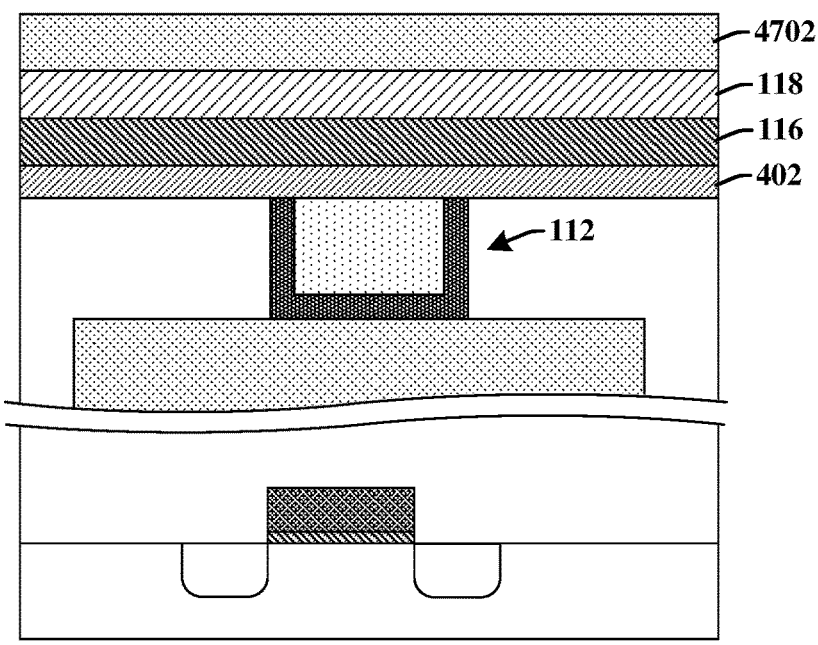

As shown in cross-sectional view 4700 of FIG. 47, a second conductive material 4702 is formed onto the metal nitride layer 118. In some embodiments, the second conductive material 4702 may be formed as described in the description associated with FIG. 18.

Figure 48:
Figure 48:
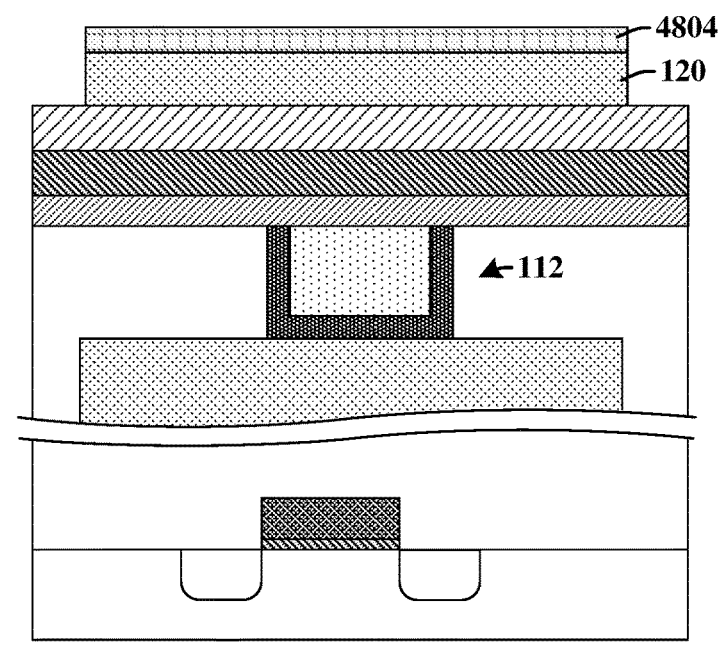

As shown in cross-sectional view 4800 of FIG. 48, the second conductive material (e.g., 4702 of FIG. 47) is patterned to form a first upper interconnect 120. The first upper interconnect 120 is over the metal nitride layer 118 as viewed in cross-sectional view 4800. In some embodiments, the second conductive material may be patterned by using a first patterning process that selectively exposes the second conductive material to a first etchant 4802 according to a first mask 4804.

Figure 49:
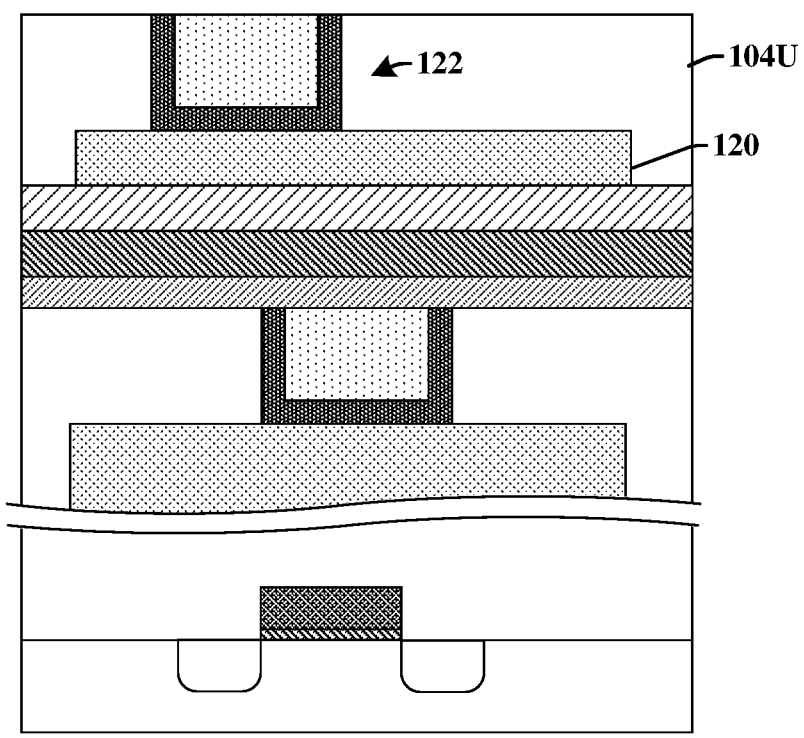

As shown in cross-sectional view 4900 of FIG. 49, an upper ILD structure 104U is formed over and laterally surrounding the first upper interconnect 120. A second upper interconnect 122 is formed within the upper ILD structure 104U. The second upper interconnect 122 extends through the upper ILD layer to contact the first upper interconnect 120.

Figure 50:
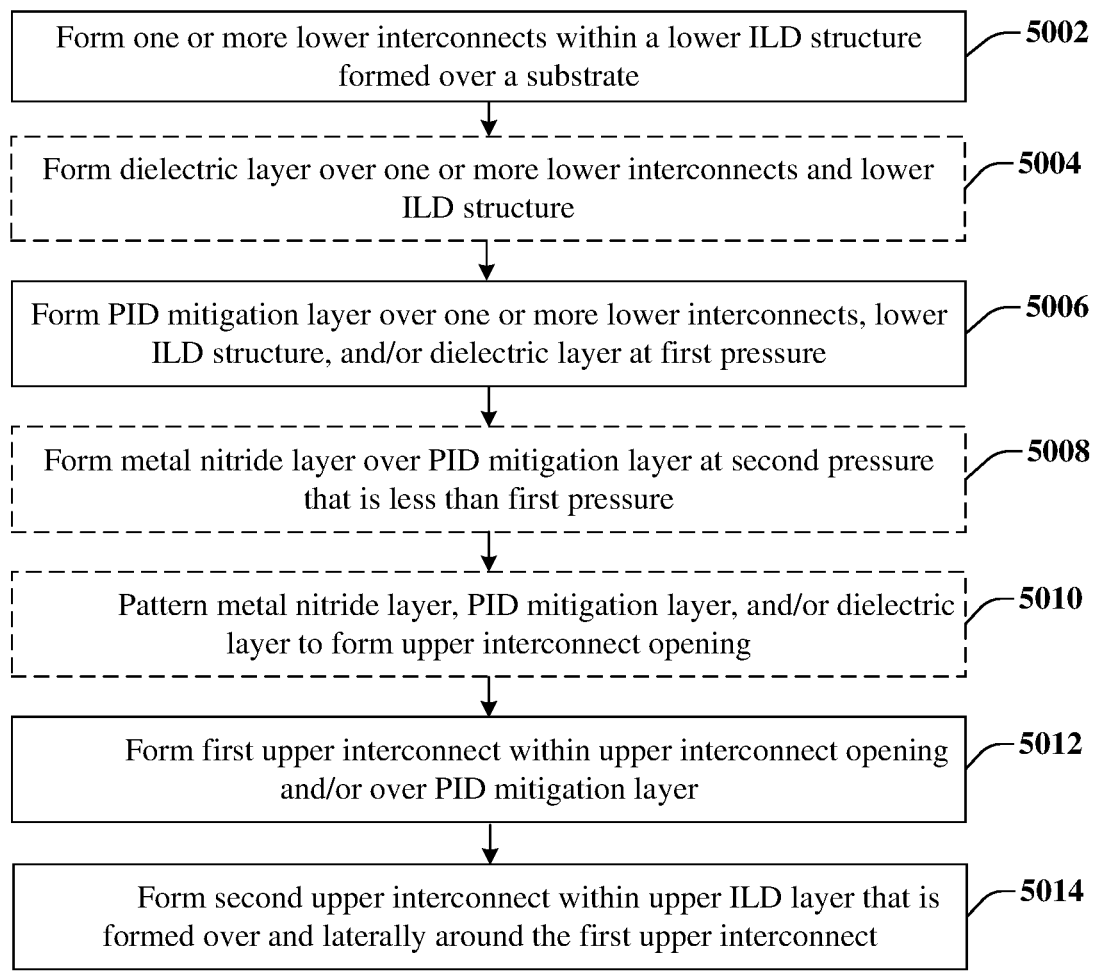
FIG. 50 illustrates a flow diagram of some embodiments of a method of an integrated chip structure comprising a PID mitigation layer.

FIG. 50 illustrates a flow diagram of some embodiments of a method 5000 of forming an integrated chip structure comprising a disclosed PID mitigation layer.

While method 5000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 5002, one or more lower interconnects are formed within a lower ILD structure over a substrate. FIGS. 10-14 illustrate cross-sectional views 1000-1400 of some embodiments corresponding to act 5002. FIGS. 21, 29, 35, and 43 illustrate cross-sectional views 2100, 2900, 3500, and 4300 illustrate some alternative embodiments corresponding to act 5002.

At act 5004, a dielectric layer may be formed over the one or more lower interconnects and the lower ILD structure in some embodiments. FIG. 22 illustrates a cross-sectional view 2200 of some embodiments corresponding to act 5004. FIG. 44 illustrates a cross-sectional view 4400 of some alternative embodiments corresponding to act 5004.

At act 5006, a PID mitigation layer is formed over the one or more lower interconnects, the lower ILD structure, and/or the dielectric layer at a first pressure. FIGS. 15A, 23, 30, 36-37, and 45 illustrate cross-sectional views 1500, 2300, 3000, 3600-3700, and 4500 of some embodiments corresponding to act 5006.

At act 5008, a metal nitride layer is formed over the PID mitigation layer at a second pressure that is less than the first pressure, in some embodiments. FIGS. 16, 24, 38, and 46 illustrate cross-sectional views 1600, 2400, 3800, and 4600 of some embodiments corresponding to act 5008.

At act 5010, the metal nitride layer, the PID mitigation layer, and/or the dielectric layer are patterned to form an upper interconnect opening exposing the one or more lower interconnects, in some embodiments. FIGS. 17, 25, 31, and 39 illustrate cross-sectional views 1700, 2500, 3100, and 3900 of some embodiments corresponding to act 5010.

At act 5012, a first upper interconnect is formed within the upper interconnect opening and/or over the PID mitigation layer. FIGS. 18-19 illustrate cross-sectional views 1700-1800 of some embodiments corresponding to act 5012. FIGS. 26-27 illustrate cross-sectional views 2600-2700 of some alternative embodiments corresponding to act 5012. FIGS. 32-33 illustrate cross-sectional views 3200-3300 of some alternative embodiments corresponding to act 5012. FIGS. 40-41 illustrate cross-sectional views 4000-4100 of some alternative embodiments corresponding to act 5012. FIGS. 47-48 illustrate cross-sectional views 4700-4800 of some alternative embodiments corresponding to act 5012.

At act 5014, a second upper interconnect is formed within an upper ILD structure that is formed over and laterally around the first upper interconnect. FIGS. 20, 28, 34, 42, and 49 illustrate cross-sectional views 2000, 2800, 3400, 4200, and 4900 of some embodiments corresponding to act 5014.

Accordingly, the present disclosure relates to an integrated chip structure comprising a plasma induced damage (PID) mitigation layer configured to reduce plasma induced damage.

In some embodiments, the present disclosure relates to an integrated chip structure. The integrated chip structure includes a substrate; one or more lower interconnects disposed within a lower inter-level dielectric (ILD) structure over the substrate; a plasma induced damage (PID) mitigation layer disposed over the lower ILD structure, the PID mitigation layer having a porous structure including a metal; and a first upper interconnect laterally surrounded by an upper ILD structure over the PID mitigation layer, the first upper interconnect extending from over the PID mitigation layer to the one or more lower interconnects. In some embodiments, the integrated chip structure further includes a metal nitride layer vertically between the PID mitigation layer and the upper ILD structure, the first upper interconnect extending from within the upper ILD structure to through the PID mitigation layer and the metal nitride layer. In some embodiments, the PID mitigation layer has a lower concentration of nitrogen than the metal nitride layer. In some embodiments, the PID mitigation layer has a substantially flat upper surface extending between outermost sidewalls of the PID mitigation layer. In some embodiments, the PID mitigation layer includes titanium nitride or tantalum nitride. In some embodiments, the PID mitigation layer has a ratio of the metal to nitrogen that is in a range that is between approximately 1 and approximately 1.5. In some embodiments, the integrated chip structure further includes a dielectric layer arranged between the lower ILD structure and the PID mitigation layer, the first upper interconnect continuously extending from directly above the PID mitigation layer to physically contact the one or more lower interconnects. In some embodiments, the integrated chip structure further includes a dielectric layer arranged over the upper ILD structure; a second PID mitigation layer disposed over the dielectric layer, the second PID mitigation layer having a second porous structure having a second metal and nitrogen; and a third upper interconnect disposed within an additional upper ILD structure over the second PID mitigation layer, the third upper interconnect extending from within the additional upper ILD structure to through the second PID mitigation layer and the dielectric layer.

In other embodiments, the present disclosure relates to an integrated chip structure. The integrated chip structure includes one or more lower interconnects disposed within a lower inter-level dielectric (ILD) structure over a substrate; a plasma induced damage (PID) mitigation layer disposed over the lower ILD structure, the PID mitigation layer including a metal nitride having a metal to nitrogen ratio that is greater than 1; and a first upper interconnect disposed within an upper ILD structure over the PID mitigation layer, the first upper interconnect extending through the upper ILD structure and the PID mitigation layer to contact the one or more lower interconnects. In some embodiments, the first upper interconnect continuously extends from directly between sidewalls of the PID mitigation layer to directly over a top surface of the PID mitigation layer. In some embodiments, the first upper interconnect has an upper surface that is directly between a lower surface of the upper ILD structure and the top surface of the PID mitigation layer. In some embodiments, the integrated chip structure further includes a metal nitride layer vertically between the PID mitigation layer and the upper ILD structure, wherein the metal nitride layer has a higher concentration of nitrogen than the PID mitigation layer. In some embodiments, the PID mitigation layer has a thickness of greater than approximately 30 Angstroms.

In yet other embodiments, the present disclosure relates to a method of forming an integrated chip structure. The method includes forming one or more lower interconnects within a lower dielectric (ILD) structure over a substrate; forming a plasma induced damage (PID) mitigation layer over the lower ILD structure, the PID mitigation layer including a metal nitride formed at a first pressure; forming a metal nitride layer over the PID mitigation layer, wherein the metal nitride layer is formed at a second pressure that is less than the first pressure; patterning the PID mitigation layer and the metal nitride layer to form an upper interconnect opening; and forming a conductive material within the upper interconnect opening and over the metal nitride layer. In some embodiments, the PID mitigation layer includes a porous structure having fibrous or columnar structures. In some embodiments, the method further includes patterning the conductive material to form a first upper interconnect; and forming an upper inter-level dielectric (ILD) structure over the first upper interconnect. In some embodiments, the first pressure is greater than approximately 20 mTorr. In some embodiments, the PID mitigation layer has a lower concentration of nitrogen than the metal nitride layer. In some embodiments, the PID mitigation layer has a nitrogen concentration of between approximately 40% and approximately 50%. In some embodiments, the PID mitigation layer and the metal nitride layer are formed using plasma deposition processes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip structure, comprising:

forming one or more lower interconnects within a lower inter-level dielectric (ILD) structure over a substrate;

forming a plasma induced damage (PID) mitigation layer over the lower ILD structure, wherein the PID mitigation layer comprises a metal nitride formed at a first pressure;

forming a metal nitride layer over the PID mitigation layer, wherein the metal nitride layer is formed at a second pressure that is less than the first pressure, and wherein the PID mitigation layer has a different concentration of nitrogen than the metal nitride layer;

patterning the PID mitigation layer and the metal nitride layer to form an upper interconnect opening; and forming a conductive material within the upper interconnect opening and over the metal nitride layer.

2. The method of claim 1, wherein the conductive material has a lower surface physically contacting a top of the metal nitride layer.

3. The method of claim 1, further comprising:
patterning the conductive material to form a first upper interconnect; and
forming an upper inter-level dielectric (ILD) structure over the first upper interconnect.

4. The method of claim 1, wherein the first pressure is greater than approximately 20 mTorr and the second pressure is less than or equal to approximately 7 mTorr.

5. The method of claim 1, wherein the PID mitigation layer has a lower concentration of nitrogen than the metal nitride layer.

6. The method of claim 1, wherein the PID mitigation layer comprises a metal nitride having a metal to nitrogen ratio that is greater than 1.

7. The method of claim 1, wherein the upper interconnect opening exposes an upper surface of the lower ILD structure.

8. A method of forming an integrated chip structure, comprising:
forming one or more lower interconnects within a lower inter-level dielectric (ILD) structure over a substrate;
forming a plasma induced damage (PID) mitigation layer over the lower ILD structure, wherein the PID mitigation layer comprises a metal nitride formed at a first pressure;
forming a metal nitride layer over the PID mitigation layer, wherein the metal nitride layer is formed at a second pressure that is less than the first pressure, and wherein the PID mitigation layer has a different concentration of nitrogen than the metal nitride layer;
patterning the PID mitigation layer and the metal nitride layer to form an opening;
forming a conductive material within the opening and over the metal nitride layer;
patterning the conductive material according to a masking layer to form an upper interconnect; and
forming an upper ILD structure over and along sidewalls of the upper interconnect.

9. The method of claim 8, wherein the PID mitigation layer is formed to have a first roughness and the metal nitride layer is formed to have a second roughness that is less than the first roughness.

10. The method of claim 8, wherein the PID mitigation layer comprises a metal nitride having a metal to nitrogen ratio that is greater than 1.

11. The method of claim 8, wherein the upper interconnect has a first width directly between sidewalls of the PID mitigation layer and a second width measured along a lower surface contacting a top of the metal nitride layer, the second width being larger than the first width.

12. The method of claim 8, wherein the metal nitride layer has a higher concentration of nitrogen than the PID mitigation layer.

13. The method of claim 8, wherein the PID mitigation layer further comprises silicon and oxygen.

14. The method of claim 8, wherein the opening exposes an upper surface of the lower ILD structure.

15. A method of forming an integrated chip structure, comprising:
forming one or more lower interconnects within a lower inter-level dielectric (ILD) structure over a substrate;
forming a plasma induced damage (PID) mitigation layer over the lower ILD structure, wherein the PID mitigation layer is formed at a first pressure;
forming a metal nitride layer over the PID mitigation layer, wherein the metal nitride layer is formed at a second pressure that is less than the first pressure, and wherein the PID mitigation layer has a different concentration of nitrogen than the metal nitride layer;
patterning the PID mitigation layer and the metal nitride layer to form an upper interconnect opening; and
forming a conductive material within the upper interconnect opening and over the metal nitride layer.

16. The method of claim 15, wherein the upper interconnect has a lower surface contacting a top of the metal nitride layer.

17. The method of claim 15, wherein the PID mitigation layer further comprises silicon.

18. The method of claim 15, wherein the upper interconnect opening exposes an upper surface of the lower ILD structure that is laterally between the PID mitigation layer and an outer sidewall of the one or more lower interconnects.

19. The method of claim 15, wherein the PID mitigation layer and the metal nitride layer are formed to have a different upper surface roughness.

20. The method of claim 15, wherein the PID mitigation layer and the metal nitride layer are a same chemical compound and have the different concentration of nitrogen.

* * * * *